(12) United States Patent
Gustavson et al.

(10) Patent No.: US 6,226,723 B1
(45) Date of Patent: May 1, 2001

(54) BIFURCATED DATA AND COMMAND/ADDRESS COMMUNICATION BUS ARCHITECTURE FOR RANDOM ACCESS MEMORIES EMPLOYING SYNCHRONOUS COMMUNICATION PROTOCOLS

(75) Inventors: David B. Gustavson, Los Altos; David V. James, Palo Alto; Hans A. Wiggers, Saratoga, all of CA (US)

(73) Assignee: Advanced Memory International, Inc., San Jose, CA (US)

( * ) Notice: Subject to any disclaimer, the term of this patent is extended or adjusted under 35 U.S.C. 154(b) by 0 days.

(21) Appl. No.: 08/909,299

(22) Filed: Aug. 11, 1997

Related U.S. Application Data

(60) Provisional application No. 60/026,419, filed on Sep. 20, 1996, and provisional application No. 60/026,896, filed on Sep. 20, 1996.

(51) Int. Cl.$^7$ ....................................................... G06F 12/00
(52) U.S. Cl. ........................ 711/170; 711/168; 711/154; 711/211
(58) Field of Search ................................ 711/211, 167, 711/170, 168, 157, 151, 154, 149; 710/126; 395/559

(56) References Cited

U.S. PATENT DOCUMENTS

| | | | |
|---|---|---|---|
| 4,366,538 | * 12/1982 | Johnson et al. | 711/167 |
| 4,954,992 | 9/1990 | Kumanoya et al. | 365/207 |
| 5,058,051 | * 10/1991 | Brooks | 711/167 |
| 5,289,431 | 2/1994 | Konishi | 365/230.03 |
| 5,307,314 | 4/1994 | Lee | 365/189.04 |
| 5,323,349 | 6/1994 | Hamade et al. | 365/207 |
| 5,394,541 | * 2/1995 | Chesley et al. | 711/167 |
| 5,596,731 | 1/1997 | Martinez, Jr. et al. | 395/309 |
| 5,737,587 | * 4/1998 | Leung et al. | 395/559 |
| 5,805,873 | * 9/1998 | Roy | 395/559 |
| 5,813,038 | * 9/1998 | Thome et al. | 711/154 |
| 5,831,925 | * 11/1998 | Brown et al. | 365/230.03 |

* cited by examiner

*Primary Examiner*—Matthew Kim
*Assistant Examiner*—Fred F. Tzeng
(74) *Attorney, Agent, or Firm*—Fliesler, Dubb, Meyer & Lovejoy LLP

(57) ABSTRACT

A computer memory device featuring a high-bandwidth memory interface to transfer information between a controller and the memory cells of a memory modules. Bifurcated communication buses is provided to take advantage of the interface. One of the bifurcated communication busses is dedicated to data information transfer, dataLink, between the controller and the memory modules, with the remaining bus, commandLink, being dedicated to command/address information transfer therebetween. This facilitates communication between the controller and the memory modules using information packets, bifurcated into data packets and command/address packets. To that end, the interface circuitry includes encoded chip select techniques that employs slaveId comparison logic, a plurality of control registers and delay registers to regulate the synchronization of communication transfers over the commandLink and the dataLink, as well as a queue register in which the packets are temporarily stored. The packets are scheduled to be placed on the appropriate busses so as to maximize data transfer, while minimizing power consumption of the memory device. Synchronization of the communication transfers on the commandLink and the dataLink is achieved during initialization of the memory device and may be periodically checked during normal operations, without degrading transfer throughput.

18 Claims, 9 Drawing Sheets

BIFURCATED DATA AND COMMAND/ADDRESS COMMUNICATION BUS ARCHITECTURE FOR RANDOM ACCESS MEMORIES EMPLOYING SYNCHRONOUS COMMUNICATION PROTOCOLS

CROSS REFERENCE TO RELATED APPLICATION

This application is a nonprovisional application of U.S. provisional patent application "PACKETIZED COMMUNICATED FOR A HIGH PERFORMANCE RANDOM ACCESS MEMORY SYSTEM," U.S. Ser. No. 60/026,419, filed Sep. 20, 1996, having David B. Gustavson, David V. James and Hans A. Wiggers listed as co-inventors; and U.S. provisional application "PACKETS FOR A HIGH PERFORMANCE RANDOM ACCESS MEMORY SYSTEM," U.S. Ser. No. 60/026,896, filed Sep. 20, 1996, having David B. Gustavson, David V. James and Hans A. Wiggers listed as co-inventors. Each of the above referenced applications are hereby incorporated by reference.

PAPER APPENDIX

A Paper Appendix of an IEEE draft standard P1596.7-199X including an embodiment of the invention comprising sixty-seven sheets is included herewith and incorporated by reference in its entirety for all purposes.

BACKGROUND OF THE INVENTION

The present invention relates to computer memories. More particularly, the present invention pertains to an improved memory interface particularly useful for dynamic random access memories and communication protocols therefor.

There is a constant need to increase the performance of various types of memories employed in computers, particularly dynamic random access memory (DRAM) devices. In a typical DRAM, shown in FIG. 1, digital information, or data, is stored in an arrangement of memory cells 3, configured in a matrix of intersecting rows 5 and columns 6. The rows 5 may be referred to as word lines 5. Each memory cell comprises a storage capacitor (not shown) capable of holding a charge and a metal-oxide semiconductor field effect transistor (MOSFET) (not shown) for accessing the capacitor charge; hereinafter this transistor is referred to as an access transistor. The charge is a voltage potential referred to as a data bit and is typified as either a high voltage or a low voltage. Therefore, the memory has two states, often thought of as the true logic state and the complementary logic state. The data bit is amplified and latched to the digit lines 7 by a sense amplifier 8.

There are two operations available in the DRAM memory; a bit of data may be stored in a specific cell in the write mode, or a bit of data may be retrieved from a specific cell in the read mode. The data is either transferred from the digit lines 7 to Input/Output lines (I/O) 9 in the read mode; or transferred from the I/O lines 9 to the digit lines 7 in the write mode. In either case, the data is transferred through MOSFETs 10 used as switching devices and called decode transistors. For each bit of data stored, its true logic state is available at a first I/O line 11 and its complementary logic state is available at a second I/O line 13, designated I/O complement. For purposes of this discussion, I/O and I/O complement lines are often referred to as just I/O lines 9. Although each cell 3 is only connected to one digit line 7 through an activated access transistor, each cell 3 is electrically referenced to two digit lines 7, referred to as a digit line pair 15, through the sense amplifiers 8. The digit line pair 15 comprises the "digit line" 17 for coupling true data and the "digit bar line" 19 for coupling complementary data. Typically, the digit line 17 is referred to as digit and the digit bar line 19 is referred to as digit bar. The digit line pair 15 couples the true and complementary data between the selected cell 3 and the I/O lines.

In order to read from or write to a cell 3, the particular cell 3 in question must be selected or sometimes referred to as "addressed." In addition, control information must be received from a controller (not shown), such as a CPU, to indicate whether a write operation or a read operation is to occur. A row 5 of cells 3 is selected and connected to the sense amplifier 8 when the row decoder 21 activates the word line 5. The column decoder 23 connects a subset of the sense amplifiers 8 to the I/O lines of the memory.

Prior art attempts to enhance the performance of a DRAM memory, such as the one shown in FIG. 1, has involved routing control and data information on differing bus architectures. One attempt involves transmitting read and write data over separate data lines, typically referred to as a separated I/O type of semiconductor memory. Examples of a separated I/O memory as disclosed in U.S. Pat. No. 5,323,349 to Hamade et al., U.S. Pat. No. 5,307,314 to Lee, and U.S. Pat. No. 4,954,992 to Kumanoya et al. As described in those patents, separated I/O memory is typically employed on a dynamic random access memory (DRAM).

In the I/O separated memory, the control and address information are on communication lines which are separate from the data lines. A variation of the previously described separated I/O memory involves using a common uni-directional bus for control and data information transmitted to the DRAM. A second uni-directional bus is employed to transmit data information coming from the DRAM. This provides good performance for a relatively uniform mix of read and writes, but performance degrades rapidly for long sequences of either reading or writing data, which occurs commonly. One of the busses is substantially underutilized, resulting in a reduction in throughput.

Another attempt at enhancing the performance of a DRAM involves having a bi-directional bus on which all the data information and control information are transmitted. This requires time multiplexing the transmission of the control information, the address information and the data, reducing the effective throughput of the device well below the bandwidth limit of the bus and increasing the power consumed to effectuate data transfers.

What is needed, therefore, is a computer memory device that more efficiently utilizes bus bandwidth during read and write operations, while reducing the power consumed to achieve the same.

SUMMARY OF THE INVENTION

A computer memory device features a high-bandwidth memory interface to transfer information between a controller and the memory cells of a memory module. Bifurcated communication busses are provided to take advantage of the memory interface. One of the busses, dataLink, is dedicated to data information transfer, between the controller and the memory modules, with the remaining bus, commandLink, being dedicated to command/address information transfer therebetween. This facilitates communication between the controller and the memory modules using information packets, bifurcated into data packets and command/address packets. To that end, the interface circuitry includes encoded chip select techniques that employs slaveId comparison logic, a plurality of control registers and delay registers to regulate the synchronization of communication transfers over the commandLink and the dataLink, as well as a queue register in which the packets are temporarily stored. The packets are scheduled to be placed on the appropriate busses so as to maximize data transfer, while minimizing power consumption of the memory device. Synchronization of the communication transfers on the commandLink and the dataLink is achieved during initialization of the memory device and may be periodically checked during normal operations, without degrading transfer throughput. In this fashion, the memory device may be easily scaled so that variable bandwidth data transfers may be provided while maximizing the quantity of data transferred on the dataLink and reducing the power necessary to achieve the same.

Typically, the computer memory device includes an array of memory modules. Each of the memory modules includes a matrix of memory cells and a plurality of data transfer ports, a plurality of control transfer ports, with the high-bandwidth memory interface coupled between the matrix of memory cells and the plurality of data and control transfer ports. The data transfer ports may be separate input/output ports or a port which handles both data input and data output. The controller has a system input port for receiving information from a central processing unit, CPU, and a plurality of data output ports, as well as a plurality of control/address output ports. The data output ports and the control/address output ports are in signal communication with the array of memory modules via the dataLink and the commandLink, respectively. Specifically, the dataLink is coupled between the data transfer ports and the data output ports, and the commandLink is coupled between control transfer ports and the control output ports. The commandLink is connected so that one of the plurality of control transfer ports of each of the memory modules is connected in common to receive, concurrently, the chip select coding information. The array of memory modules may consist of a 1×1 array of dynamic random access memory integrated circuits.

The array may, however, include a plurality of columns of memory module, with each column having a dataLink which is electrically isolated from the dataLink associated with the remaining columns of memory modules. Configuring the dataLinks in this fashion may result in command/address signals propagating over the commandLink over a distance differing from the distance over which the data signals propagate over the dataLink. The controller is adapted to produce packets of information implementing synchronization protocols to adjust the transfer time of information over both the dataLink and the commandLink. In addition, to further reduce the power consumed by the memory device, the controller implements a protocol to vary the power level of the memory device to an intermediate level, standbyMode. In the standbyMode, the power consumption of the memory device is greatly reduced without substantially sacrificing response time to information transmitted over the commandLink or the dataLink.

DETAILED DESCRIPTION OF THE INVENTION

Figure 2:
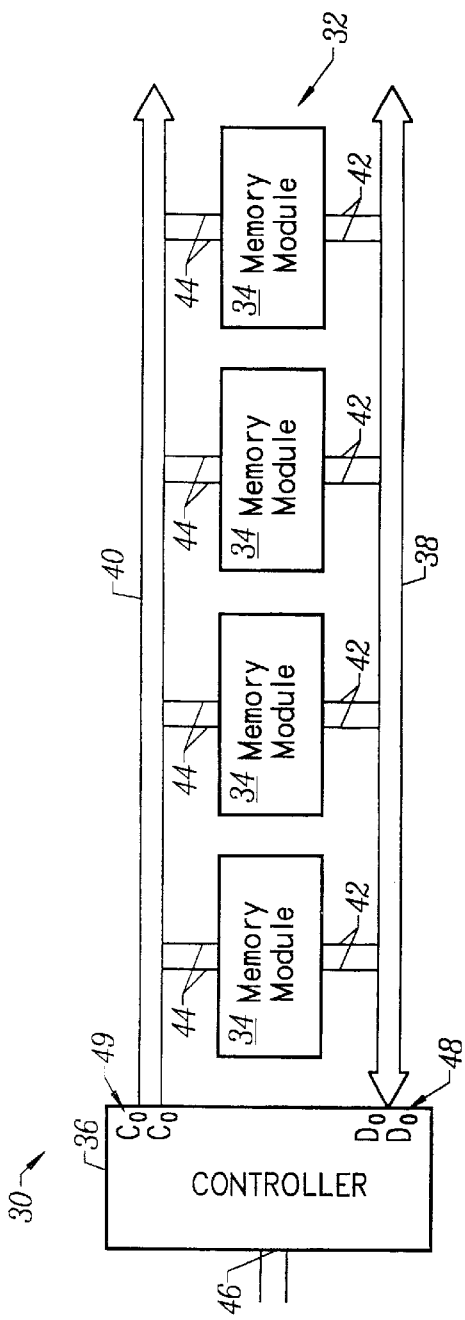
FIG. 2 is a block diagram of a computer memory device in accord with the present invention.

Referring to FIG. 2, the memory device 30 that may be employed in a personal computer (not shown) or workstation (not shown), includes an array 32 of memory modules 34, such as a dynamic random access memory integrated circuit (DRAM), coupled to a controller 36 via bifurcated communication busses 38 and 40. Communication bus 38 is dedicated to data information transfer, referred to as dataLink, between the controller 36 and the memory modules 34, and communication bus 40, referred to as commandLink, is dedicated to command/address information transfer therebetween. The conmandLink 40 is unidirectional, and the dataLink 38 is bi-directional. Specifically, each memory module 34 includes a plurality of data transfer ports 42 and a plurality of control transfer ports 44. Although it is preferred that the data transfer ports are combined input/output, I/O ports, separated I/O ports may also be employed. The controller 36 has a system input port 46, for receiving information from a central processing unit (not shown), as well as a plurality of data output ports 48 and a plurality of control/address output ports 49. The data output ports 48 and the control/address output ports 49 are in data communication with the array 32 of memory modules 34 via the dataLink 38 and the commandLink 40, respectively. The commandLink 40 is coupled to the array 32 so that one of the plurality of control transfer ports of each of the memory modules 34 is connected in common to receive, concurrently, control/address signals. Although any signals may be employed on both the dataLink 38 and the commandLink 40, it is preferred to use signals associated with high performance, low-voltage-swing technology, such as JEDEC SSTL-3 signals.

Any width bus may be employed to form the commandLink 40 and the dataLink 38, depending upon the application. The dataLink 38 width is chosen so as to compromise between the cost of pins, bonding pads, board area, and the bandwidth required for each memory module 34. Typically the width of the dataLink 38 is a multiple of eight, so that the byte addresses map trivially to the data position thereon. The width of the commandLink 40, on the other hand, is selected so that the command/address information transmitted thereon takes no longer time to propagate between the memory modules and the controller 36 than the time required for the corresponding data information to propagate on the dataLink 38. In this fashion, a sufficient quantity of command/address information may be transmitted over the commandLink 40 to maximize transmission of data information over the dataLink 38. In the exemplary embodiment, a ten bit wide bus is employed for the commandLink 40, and a sixteen bit wide bus is employed for the dataLink 38.

Figure 3:
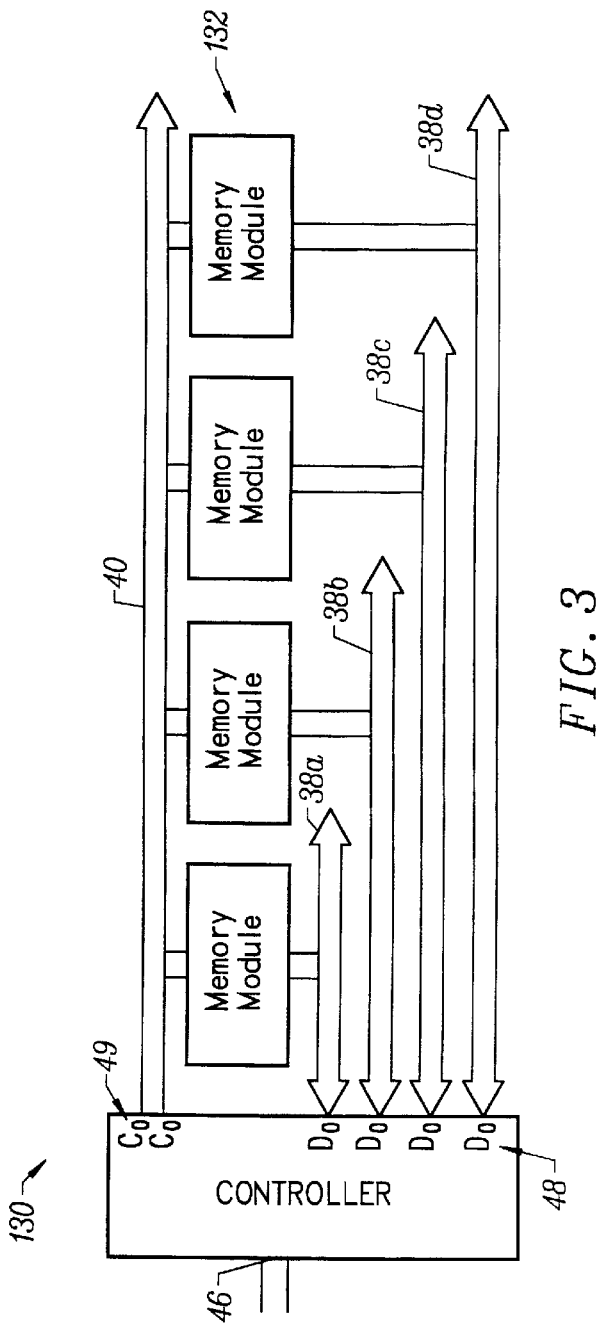
FIG. 3 is a block diagram of an alternate embodiment of the computer memory device shown in FIG. 2 including multiple columns of memory modules.

An advantage with employing the aforementioned bifurcated communication busses 38 and 40 is that the data bandwidth of the memory system 30 may be easily scaled up or scaled down. Specifically, as shown in FIG. 3, with the commandLink 40 connected in common with all of the memory modules 34, the data bandwidth of memory system 130 may be easily increased by having each memory module 34 uniquely associated with a separate dataLink 38a, 3b, 38c and 38d. In this fashion, a one-row multiple-column, 1×N, array 132 of memory modules 34 is formed increasing the data throughput over the system 30 shown in FIG. 2. For example, transferring a sixty-four byte data burst, on the system 30 shown in FIG. 2, would require the controller 36 to request eight bursts of data be transferred over the dataLink 40. This results in two bytes being transferred during a given unit of time for a total of eight bytes being transferred per burst.

The higher performance system, shown in FIG. 3, having four separate dataLinks, 38a, 38b, 38c and 38d, requires only two bursts of data to achieve a transfer of a sixty-four byte data burst. Thus, the performance of a memory device depends upon the number and capacities of the memory modules 34, as well as the number of dataLinks 38 routed thereto. Further flexibility may be obtained by increasing the number of rows of memory modules 34, providing a memory system 230 having an N×M array 232 of memory modules 34, shown in FIG. 4.

Figure 5:
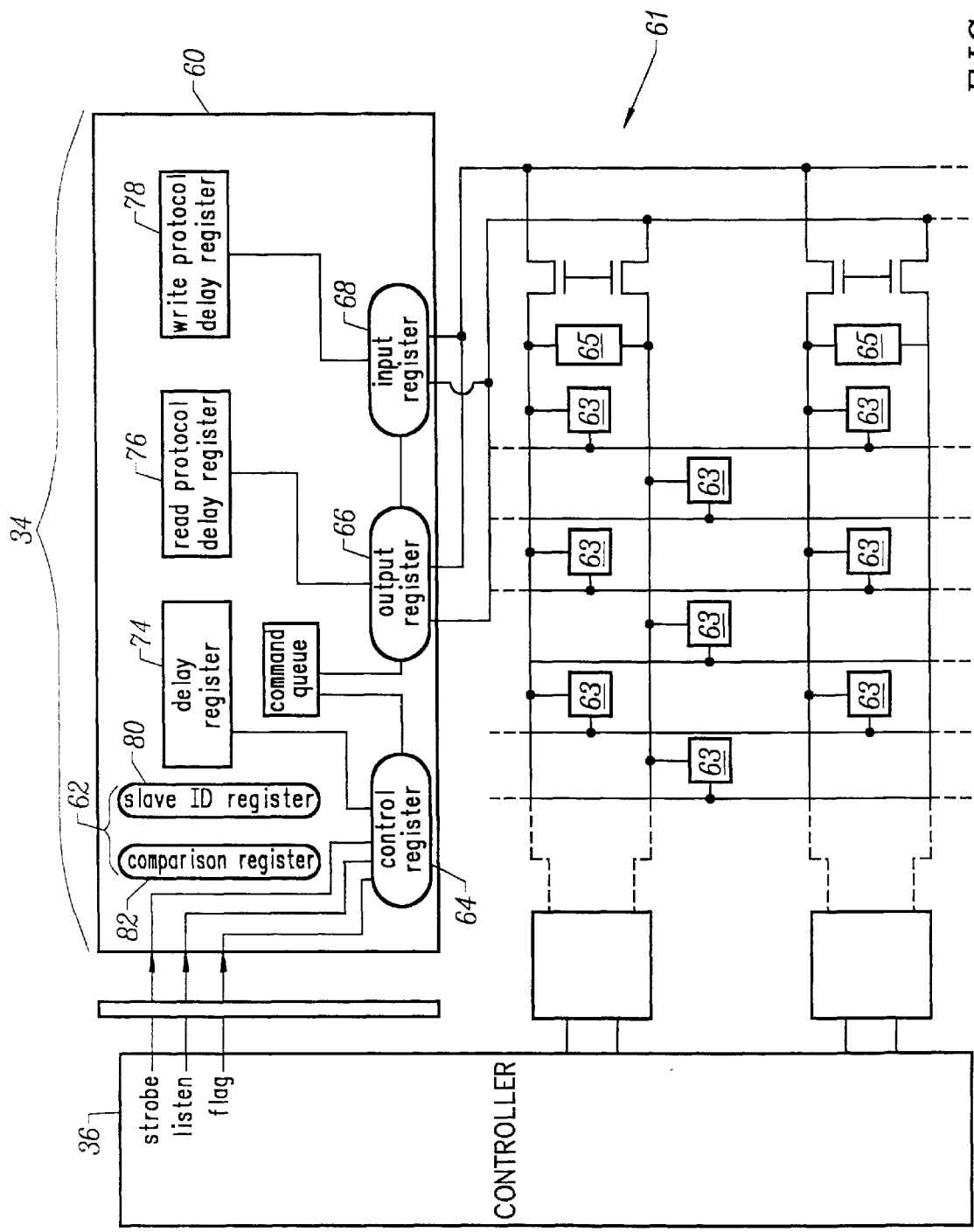
FIG. 5 is a detailed block diagram showing the high-bandwidth interface of a memory module, shown in FIG. 2.

Referring to FIGS. 2 and 5, each memory module 34 includes a high-bandwidth memory interface 60 to synchronize transfer of command/address information and data information over the commandLink 40 and the dataLink 38 with the remaining memory modules 34. The high-bandwidth memory interface 60 is coupled between a matrix 61 of memory cells 63 and the data and control transfer ports. The memory cells 63 may be coupled to a sense amplifier 65, as discussed above with respect to FIG. 1. To distinguish between the different memory modules 34 of the array 32, the memory interface 60 includes slaveId comparison logic 62, a plurality of control registers 64, 66 and 68, and delay registers 74, 76 and 78. The slaveId logic 62 includes a slaveId register 80 and a comparison register 82. Specifically, slaveId logic 62 takes advantage of encoded chip select techniques to allow the controller to distinguish between the various memory modules 34 of the array 32 by storing information in the slaveId register 80 which differs from the information in the slaveId registers 80 of the remaining memory modules 34 of the array 32. This allows concurrently transmitting, over the commandLink 40, command/address information to different subsets of multiple memory modules 34 and receiving data information over the dataLink 38, discussed more fully below.

Scaling the dataLink 38, as described above, may result in command/address information propagating over the commandLink 40 a distance differing from the distance over which the data information propagate over the dataLink 38. To avoid any discrepancy in the transmission times over the dataLink 38 and the commandLink, 40 the delay registers 74, 76 and 78 of the interface logic 60 are established, upon initialization of the memory device 30, to reduce any delay in the transmission of information on the dataLink and the commandLink. An additional advantage is provided in that memory modules 34 having differing access speeds may be employed in the same array 32, because the delay register 74, 76 and 78 may be adjusted to synchronize communication transfers over the commandLink 40 and the dataLink 38 by the different memory modules 34. Typically, the memory modules 34 would be set to transfer data at the speed of the slowest attached memory module 34. A more exacting synchronization protocol is discussed more fully below.

By reducing the delay between the command/address information transfers on the commandLink 40 and the data information transfers on the dataLink 38, the scheduling of the aforementioned transfers may be simplified to allow the use of commands to achieve multiples data burst, which save power by leaving the commandLink 40 idle at times during multiple data transfers. To that end, communication between the controller 36 and the array 32 of memory modules 36 is scheduled by the controller 36's transmission of packetized information over the dataLink 38 and the commandLink 40, shown in FIG. 1. The packets of information on the dataLink 38 contain only data information and need no address or other header information. The format of the data packet 90 transferred over the wide dataLink 38, shown in FIG. 6, includes sixteen bits of data. The one bit fields 92 are optional and typically correspond to the implementation of Error Correcting Codes associated with eighteen bit memory modules.

Figure 7:
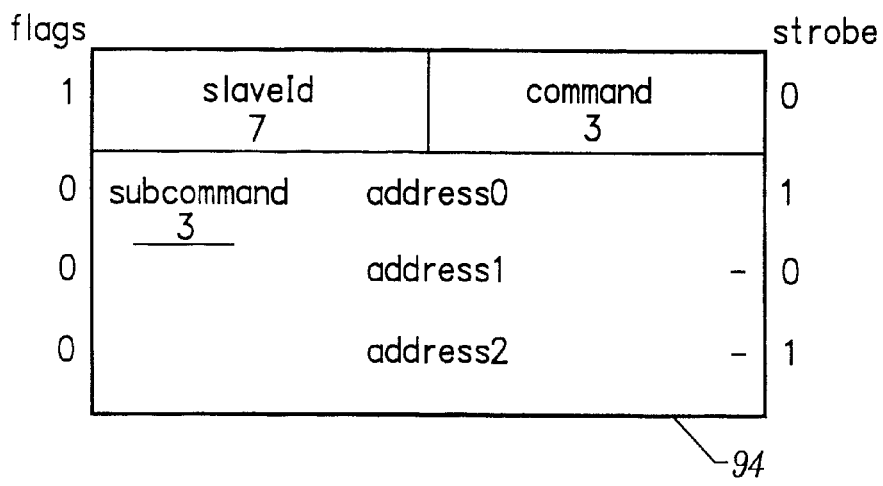
FIG. 7 is a schematic view showing a request packet employed to communicate control and address information between a controller and memory modules, shown in FIG. 1.

Referring to FIGS. 2 and 7, request packets 94, transferred on the commandLink 40, commence with a zero-to-one flag value transition. The request packets 94 may be of either a read or write request, with the flag maintaining the one value for one bit time, and then returns to zero, maintaining that value until a subsequent request packet 84 arrives. For the exemplary ten bit wide commandLink 40, the first seven bits 96 within the request packets 94 define the slaveId value in the range of zero to sixty-three. The slaveId values that exceed the sixty-three value are reserved for special addressing schemes of the memory modules 34, such as broadcast, multicast, and directed packets, as shown in Table 1. The request packets 94 also carry information specifying whether to take advantage of faster timing by accessing an already-open row, and whether to leave the row open or not, indicating whether a burst size of four, eight or sixteen bit bursts shall occur, per clock cycle, as well as determining whether to use the even or the odd dataclock signal for timing. The longer bursts may permit saving power by not driving the commandLink 40 unnecessarily. They are also convenient sizes for common cache-line bursts and common configurations.

TABLE 1

| | SlaveId Values |
|---|---|
| slaveId | Description |
| 0–63 | Dynamically allocated identifiers |
| 63 | Initial identifier assignment |

TABLE 1-continued

| | SlaveId Values |
|---|---|
| slaveId | Description |
| 64–126 | Multicast or broadcast read or write |
| 127 | Sync-pattern address |

The command and subcommand bits in the second and third fields of the request packet 94 provide command protocols for controlling the memory interface 60. This provides greater flexibility in regulating the timing and transmission of data packets 90 and request packets 94 format and general function, as shown in Table 2. Several specific command protocols for request packets are defined in the following sections.

TABLE 2

Command and Subcommand Encoding

| Command | FromRow | Size | Subcommand | R/W | LeaveRow | DataClock | Name |
|---|---|---|---|---|---|---|---|
| 000 | Open | 4 | 000 | Read | Open | Even | |
| 000 | Open | 4 | 001 | Read | Open | Odd | |
| 000 | Open | 4 | 010 | Read | Closed | Even | |
| 000 | Open | 4 | 011 | Read | Closed | Odd | |
| 000 | Open | 4 | 100 | Write | Open | Even | |
| 000 | Open | 4 | 101 | Write | Open | Odd | |
| 000 | Open | 4 | 110 | Write | Closed | Even | |
| 000 | Open | 4 | 111 | Write | Closed | Odd | |
| 001 | Open | 8 | 000 | Read | Open | Even | |
| 001 | Open | 8 | 001 | Read | Open | Odd | |
| 001 | Open | 8 | 010 | Read | Closed | Even | |
| 001 | Open | 8 | 011 | Read | Closed | Odd | |
| 001 | Open | 8 | 100 | Write | Open | Even | |
| 001 | Open | 8 | 101 | Write | Open | Odd | |
| 001 | Open | 8 | 110 | Write | Closed | Even | |
| 001 | Open | 8 | 111 | Write | Closed | Odd | |
| 010 | Open | 16 | 000 | Read | Open | Even | |
| 010 | Open | 16 | 001 | Read | Open | Odd | |
| 010 | Open | 16 | 010 | Read | Closed | Even | |
| 010 | Open | 16 | 011 | Read | Closed | Odd | |
| 010 | Open | 16 | 100 | Write | Open | Even | |
| 010 | Open | 16 | 101 | Write | Open | Odd | |
| 010 | Open | 16 | 110 | Write | Closed | Even | |
| 010 | Open | 16 | 111 | Write | Closed | Odd | |
| 011 | | | 0x0 | (R) | | Even | Load |
| 011 | | | 0x1 | (R) | | Odd | Load |
| 011 | | | 10x | (W) | | | Store |
| 011 | | | 11x | (W) | | Closed | CloseRow |
| 100 | Closed | 4 | 000 | Read | Open | Even | |
| 100 | Closed | 4 | 001 | Read | Open | Odd | |
| 100 | Closed | 4 | 010 | Read | Closed | Even | |
| 100 | Closed | 4 | 011 | Read | Closed | Odd | |
| 100 | Closed | 4 | 100 | Write | Open | Even | |
| 100 | Closed | 4 | 101 | Write | Open | Odd | |
| 100 | Closed | 4 | 110 | Write | Closed | Even | |
| 100 | Closed | 4 | 111 | Write | Closed | Odd | |
| 101 | Closed | 8 | 000 | Read | Open | Even | |
| 101 | Closed | 8 | 001 | Read | Open | Odd | |
| 101 | Closed | 8 | 010 | Read | Closed | Even | |
| 101 | Closed | 8 | 011 | Read | Closed | Odd | |
| 101 | Closed | 8 | 100 | Write | Open | Even | |
| 101 | Closed | 8 | 101 | Write | Open | Odd | |
| 101 | Closed | 8 | 110 | Write | Closed | Even | |
| 101 | Closed | 8 | 111 | Write | Closed | Odd | |
| 110 | Closed | 16 | 000 | Read | Open | Even | |
| 110 | Closed | 16 | 001 | Read | Open | Odd | |
| 110 | Closed | 16 | 010 | Read | Closed | Even | |
| 110 | Closed | 16 | 011 | Read | Closed | Odd | |
| 110 | Closed | 16 | 100 | Write | Open | Even | |
| 110 | Closed | 16 | 101 | Write | Open | Odd | |
| 110 | Closed | 16 | 110 | Write | Closed | Even | |

TABLE 2-continued

Command and Subcommand Encoding

| Command | FromRow | Size | Subcommand | R/W | LeaveRow | DataClock | Name |
|---|---|---|---|---|---|---|---|
| 110 | Closed | 16 | 111 | Write | Closed | Odd | |
| 111 | | | 000 | (R) | | | Sync (NoOp) |
| 111 | | | 001–011 | (R) | | | Reserved |
| 111 | | | 10x | (W) | | | Event |
| 111 | | | 11x | (W) | | | Write/Sync |

Where an open row corresponds to a row of memory cells within a memory module that already has the data associated therewith stored in the sense amplifier, and a closed row is a row for which the sense amplifier is not storing data. Size denotes the number of bits to be transferred, R/W corresponds to whether the data transfer consists of a read operation of a memory cell or a write operation thereto. LeaveRow corresponds to the state at which the row which was the subject of a read or write operation is to be left with the data transferred thereto in the sense amplifier or the addressed memory cell. The data clock refers to whether the protocol is to occur on an even or odd clock cycle. The packets of information, indicated in Table 2 as event protocols are defined as packets of information transmitted on the commandLink 40 for which no corresponding data information transfers occur on the dataLink. The event protocols are specified by a seven bit index value, shown in Table 3.

TABLE 3

Event Protocol Index Codes

| Index | Command | Description |
|---|---|---|
| 0 | resetHard | Take slaveId 63, initialize to reset state |
| 1 | resetSoft | Initialize to reset state |
| 2 | refresh | Autorefresh signal |
| 3 | closeRows | Close all open rows |
| 4 | increaseA | Increase the input sample delay one step |
| 5 | decreaseA | Decrease the input sample delay one step |
| 6 | increaseB | Increase the output signal delay one step |
| 7 | decreaseB | Decrease the output signal delay one step |
| 8–63 | — | Reserved |
| 64–127 | dependent | Vendor dependent |

The resetHard event protocol forces each of the slaveId registers 80 to assume slaveId value of 63, setting the slave registers 80 to an initial state. The resetHard event protocol is typically used to reset the array 32 of memory modules 34. The closeRow event closes the addressed all open rows of the matrix of memory cells of the selected memory module 34. The resetSoft event protocol initializes the control registers, e.g., 64, 66 and 68 to the initial state, without resetting a slaveId value previously assigned to the slaveId register 80. The resetSoft is typically employed for diagnostic purposes. The Refresh event protocols typically broadcast to all of the memory modules 34 of the array 32, concurrently, but could be directed to specified slaveId registers 80 with distinct refresh-timing requirements. The dependent event protocols are typically directed to a single memory module 34, and the definition of these vendor-specific event protocols is reserved for task specific definitions to be assigned as required by the application of the memory device 30.

Figure 4:
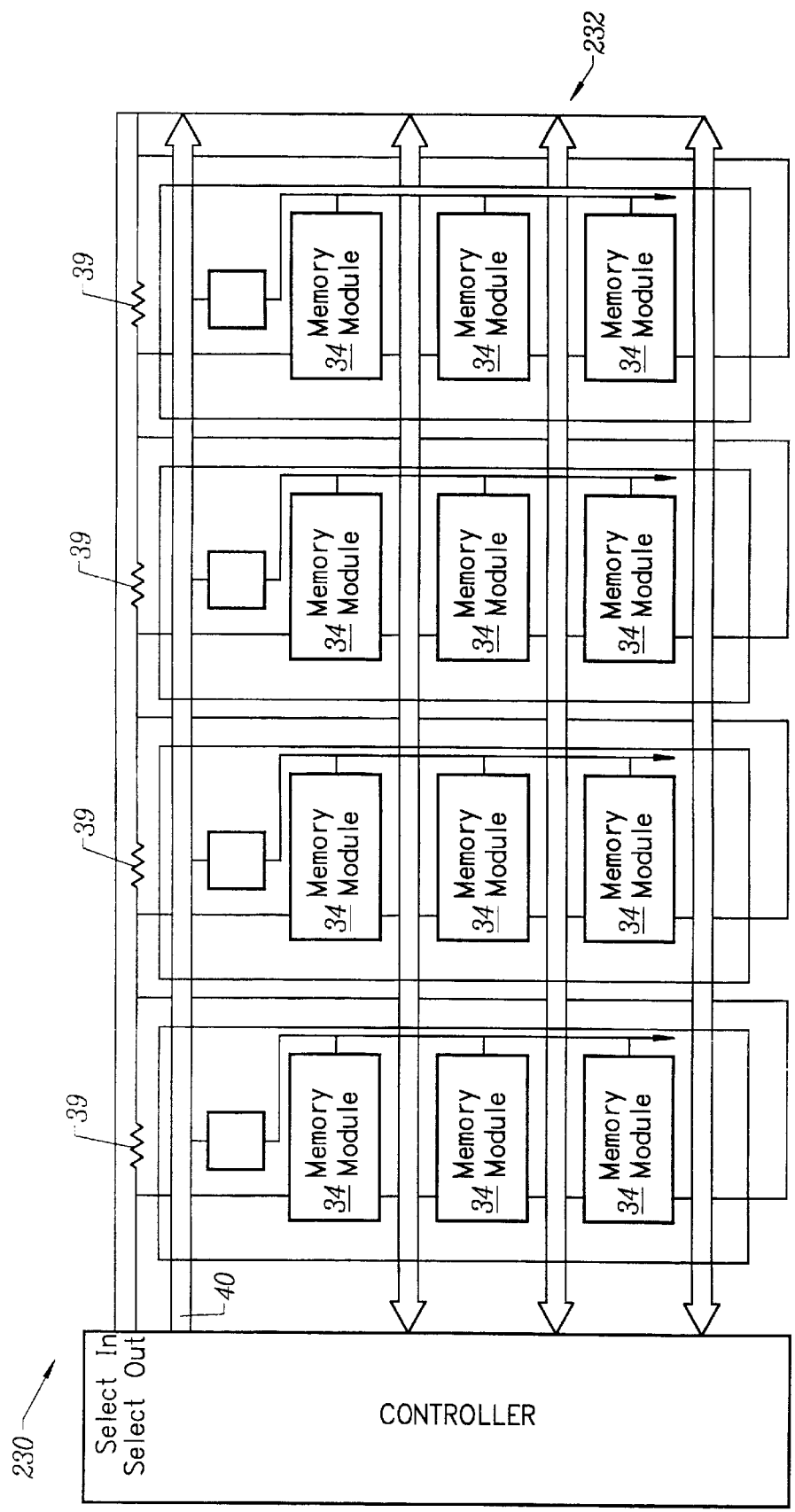
FIG. 4 is a block diagram of an alternate embodiment of the computer memory device shown in FIG. 2 including multiple columns and multiple rows of memory modules.

Referring to FIGS. 4 and 5, upon initialization of the memory device 230, the controller 36 stores, in the slaveId register 80 of each of the memory modules 34, a slaveId value which does not conflict with the slaveId values of other memory modules 34. To this end, two of the control output ports 49, the selectIn and selectOut ports, are coupled in a daisy chain configuration to the corresponding selectIn and selectOut control transfer ports 44 of the memory modules so that all information propagating over the commandLink 40 passes through all memory modules 34. This is achieved by having the memory modules 34 coupled to a system daisy chain via a module connector (not shown). The nonconflicting slaveId values are established by the controller 36 synchronizing commandLink 40 information transfers by transmitting one of the reset protocols over the commandLink 40 to each of the memory modules 34 attached thereto.

The reset protocol is initiated by power-up or by one of the event packets of information, shown above in Table 3, sent by the controller 36. The reset protocol causes each memory module 34 to initially store, in its aforementioned slaveId register 80, an initial slaveId value of sixty-three. Thereafter, the controller 36 transmits the Sync packet to allow the memory modules 34 to synchronize their respective receivers (not shown) with the commandLink 40. Specifically, delay register 74 then is adjusted by the Sync protocol so that flag values and data information are sampled reliably during the stable period between transitions. To that end, the Sync protocol causes the controller 36 to transmit 128 consecutive information packets 100, shown in FIG. 8 to the control transfer ports 44 of the memory modules 34. The Sync protocol information packet 100 has a slaveId value of 1111111 and a command value of 111. The subcommand is 000 and the remainder of the packet contains 0's. With this Sync protocol, the controller 36 provides a wave of ones and zeroes, which the memory modules 34 use to adjust the timing of the respective commandLink 40 sampling circuitry (not shown) by recording an appropriate value in delay register 74. This ensures that the information packets 102, shown in FIG. 9 and corresponding to the Store protocol, may be received at the appropriate time.

After the delay register 74 has been set, the controller 36 sets selectOut and sends store packets 102 to the aforementioned registers to update the slaveIds to their final distinct values. The memory modules 34 having a selectIn signal of 0, or a slaveId value not equal to 63 ignore the information packet 102 corresponding to the Store protocol. The selectIn and selectOut are connected in a daisy chain configuration, shown more clearly in FIG. 4. In this fashion, only the first of the unconfigured memory modules 34 processes the store packets 102 and changes its address and its selectOut signal. After the information packet 102 corresponding to the Store protocol is received by the second memory module 34, the selectIn value associated therewith is 1, so it will be affected by the next information packet 102 corresponding to the Store protocol. Thus, the first through last information packets 102 affect the first through last memory module 34, where the memory module 34 ordering is determined by their position in the daisy chain.

Because a reset occurs between shutdown recovery and the initial slaveId assignments, the selectIn/selectOut signals can be unambiguously used to provide shutdown completion status and uniqueness for the slaveId-configuration process. The remaining slaveId values are assigned by sending additional information packets 102 stores to set the slaveId values in the remaining memory modules 34. The address reassignment process stops when the final memory modules 34's selectOut signal becomes 1. The controller 36 typically sets the slaveId values in an increasing order, starting from zero. However, when advancing between multi-memory module devices 30, the slaveId value should be advanced to the next appropriate power of 2, so that multicast addressing can conveniently select all the memory modules 34 in one memory device 30 with a single command. The controller is expected to map its received system addresses to the correct (often multicast) slaveIds and offsets.

A problem encountered with establishing the slaveId values concerned partial population of the module sockets which could result from leaving sockets empty for future expansion. This results in a break in the daisy chain configuration which frustrates communication over the commandLink 40 between memory modules 36 on opposite sides of the break. To avoid this problem it is preferred that each socket of the module include a resistor 39 that bridges the pins of each socket that correspond to the selectIn and selectOut pins of the memory modules 34. The resistor 39 should be of a value which permits passing the signal yet high enough to cause no power dissipation problems during the brief periods that the signal on the two pins differ when a module is present. Typically, a 1 kΩ is employed to allow the relatively slow selectIn /selectOut signal to be sensed by the high input impedance receiver at the controller 36 or the selectIn pin of a memory module 34. In this manner a 1 kΩ resistor is coupled in series between the selectIn and selectOut pins of each socket for a memory module 34.

Subsequent to establishing the slaveId values in the slaveId registers 80, the proper value is recorded for the read protocol delay register 76 of each of the memory modules 34. This synchronizes the each memory module 34 so that transfers of data information on the dataLink occurs at the appropriate time. Specifically, the memory device 30 initially powers up, an internal feedback in the memory module 34 adjusts the dataLink delay register 76 to synchronize the memory module outputs. Thereafter, the internal sync feedback is disabled and the controller 36 transmits to each specific memory modules 34 an information packet 106 corresponding to the load protocol, shown in FIG. 10. The load protocol includes 011, following the SlaveId values. The subcommand is 0xx, and the packet contains a 7-bit index, specifying an internal control register, for example output register 64, within the addressed memory module 34 from which data information is to be transmitted onto the dataLink. In response to the load protocol, the memory module 34 emits a dataSync pattern on the dataLink: all 1-bits for one clock cycle, then all 0-bits for three clock cycles. The controller 36 may repeat this event as necessary, observing that data transitions (from 1 to 0), and storing corrected values in the read protocol delay register 76 with an information packet corresponding to the store protocol until all the memory modules 34 emit their load data at the time established by the controller 36. Typically, the range of the adjustment steps is approximately one-sixteenth of a clock cycle. Corrections for deviations in excess of one clock cycle tick may be required, in which case the controller 36 compensates by adding integer clock cycles to the response by means of the read protocol delay register 76 as necessary to keep the delays within operating range. After the dataLink delay registers 74 have been synchronized, the controller 36 may transmit the load protocol to any memory module 34 of the array 32 so that each will concurrently provide the aforementioned dataSync pattern at the controller 36, at the within a small fraction of a clock cycle.

Finally, the proper value is recorded for the write protocol delay register 78 of each of the memory modules 34. In this fashion, each of the memory modules 34 of the array 32 sample input write data information with the correct timing. This is done by sending a dataSync pattern from the controller 36 to the memory module 34 with an information packet 110 corresponding to a writeSync protocol, shown in FIG. 11. The information packet 110 of corresponding to the writeSync protocol includes the values 111, following the SlaveId values. The subcommand is 11x, and the remainder of the packet contains 0's. The results in preparation of the memory module 34 to receive a wave of 1's and 0's on the dataLink while the controller 36. The writeSync protocol differs from a normal write in that the memory module 34 stores the received data in status register 66 rather than in the memory cells, where it would corrupt data information present therein. The data information received by the status register 66 is then read back by the controller 36, using the load protocol, and compared with the desired results. The controller 36 then stores new values in the write protocol delay register 78 to adjust the timing of same. The controller 36 repeats syncWrite protocol, varying the write protocol delay register 78 timing in order to find a range of values that cause the data information to be strobed correctly. The controller 36 then sets the write protocol delay register 78 proximate to the mid-point of this range. This facilitates maintaining synchronous data transfers on the dataLink so that a incoming data information is stable the values are latched. In this fashion,, compensation may be made for clock-buffering delays and differences between the length of the commandLink path and the dataLink path.

Figure 12:
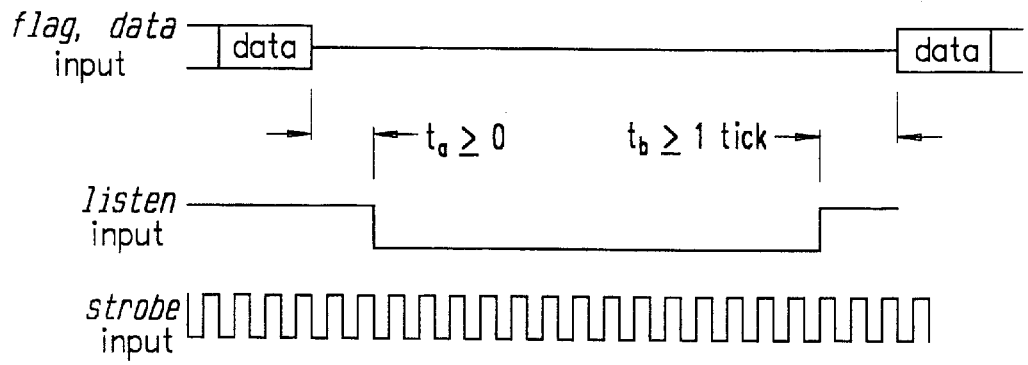
FIG. 12 is a timing diagram showing synchronization of various control signals of the memory device, shown in FIG. 1, when entering an intermediate power level.
Figure 13:
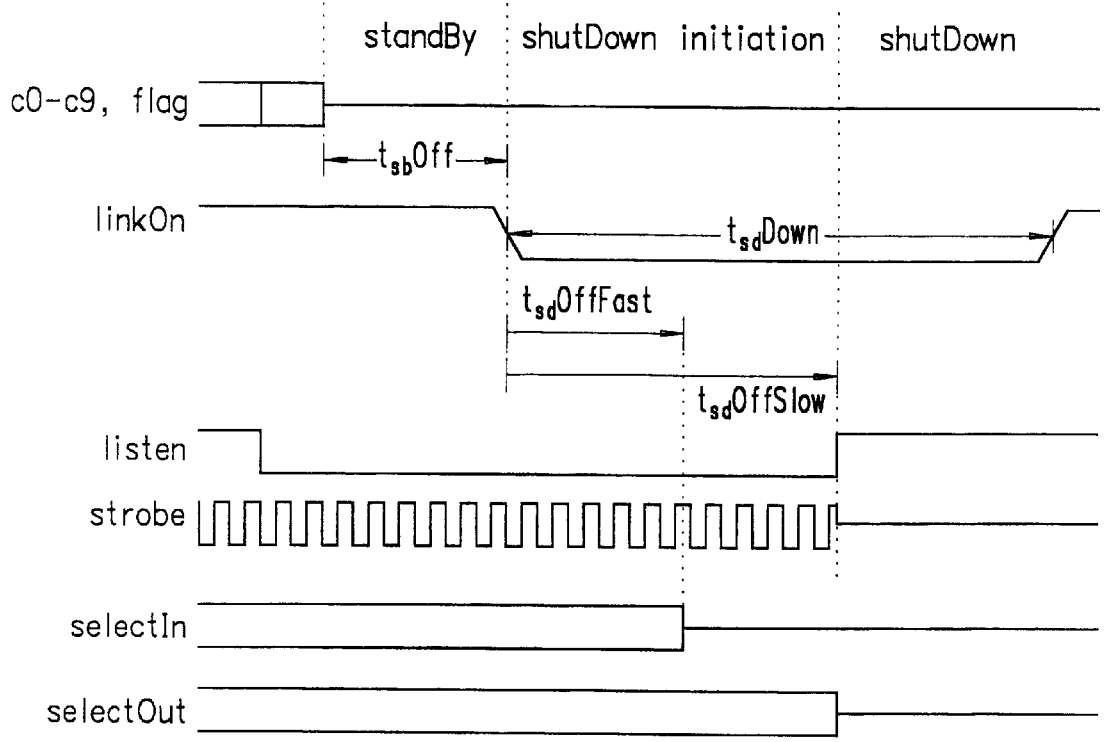
FIG. 13 is a timing diagram showing synchronization of various control signals of the memory device, shown in FIG. 1, when entering an intermediate power level.

Referring to FIGS. 12 and 13, to further decrease the power consumed by the memory device 30, an intermediate power level is provided by a standBy protocol. During the intermediate power level, the strobe signal and a listen signal are transmitted on the commandLink 40. Other data receivers and drivers in the high-bandwidth interface 60 are disabled, thus saving about 80% of I/O power. The listen signal is synchronous, with the same transition timing as flag values and data information. The listen signal shall go to 1 before an information packet, and may drop to 0 any time after a packet. After the controller 36 transmits the listen signal, the flag value and data information remain unasserted (no idles are output). The controller 36 and memory modules 34 may immediately release the other drivers and receivers, leaving dataLink in an undefined state. The StandBy protocol has no effect on the memory module 34's operational characteristics. Controllers 36 are expected to reactivate the memory modules 34 occasionally to perform autorefresh operations.

A more severe mode of power conservation is attained with the shutdown protocol, which effectively shuts the memory device 30 down. More time is required for the memory device 30 to recover after the shutdown protocol is effectuated, than the time necessary for the memory device 30 to recover from intermediate power level. The shutdown protocol forces the memory modules 34 to enable their selfrefresh circuitry. Existing slaveId values remain unchanged. Once the memory modules 34 are in the intermediate power level, the controller 36 drives the linkOn signal low to put the memory modules 34 into the power down mode employing the shutdown protocol. The power down mode is entered from the intermediate power level, so a delay of $t_{sbOff}$ is defined between the receipt of the listen signal deasserted transition and the high assertion of the linkOn signal. Specifically, the delay of $t_{sbOff}$ is required between the receipt of the standBy packet and the high-to-low transition of linkOn. Since linkOn is not a high speed signal, it is not relied on for precise timing in this protocol. Within time $t_{sbOffFast}$, the memory module 34 ignores further strobe and flag inputs, but shall ensure the validity of its selectOut signal until time $t_{sbOffSlow}$. Maintaining valid outputs while ignoring the inputs helps compensate for potential linkOn-signal skew between controller 36 and memory modules 34. To ensure completion of the shutdown protocol, a minimum power down time $t_{sbDown}$, is specified.

Typically, power is maintained while the memory modules 34 are in the power down mode, and subsequent to recovering from the power down mode, normal operations are resumed. The time allowed for recovering from the power down mode needs to account for the case where a refresh may be in progress internally at the time linkOn is sensed as high. However, if power is lost while in the power down mode, data information in the memory modules 34 may be lost and shutOff recovery sequence is required, to establish the slaveId addresses, synchronize communication, and (when necessary) clear memory to a known state.

Figure 14:
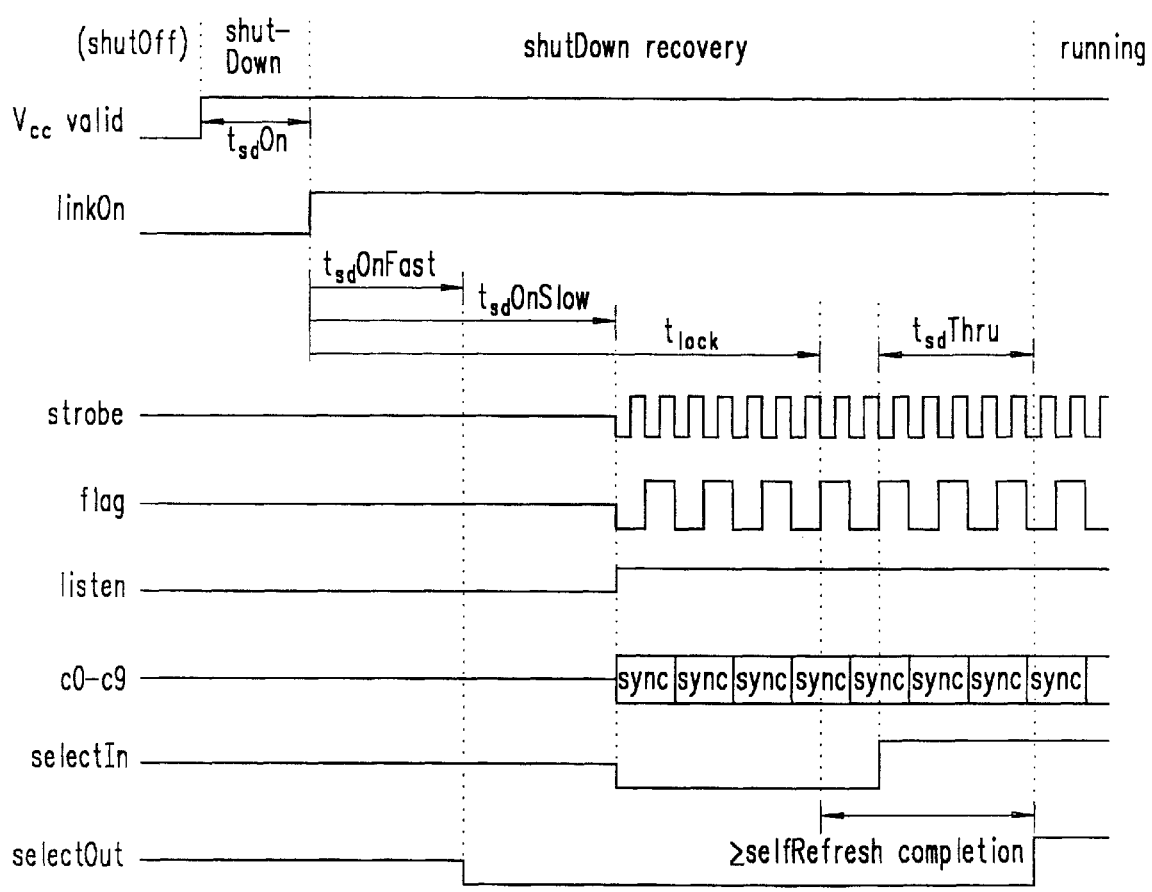
FIG. 14 is a timing diagram showing synchronization of various control signals of the memory device, shown in FIG. 1, when recovering from an intermediate power level.

Referring to FIG. 14, shutdown recovery is initiated by the low-to-high transition of the linkOn signal. Within time $t_{sbOnFast}$, memory modules 34 drive their selectOut to zero. Until time $t_{sbOnSlow}$, memory modules 34 ignore input signals; at that time, they may adjust their input receivers based on the strobe signal. The memory modules 34's receiver circuits shall be synchronized within $t_{lock}$. After that time, and after completing any selfrefresh operation that may be in progress, the memory module allows the selectIn signal to propagate to the selectOut output, with a delay not to exceed $t_{sdThru}$. The selectIn /selectOut signal, are expected to be daisy-chained through all memory modules 34, and the controller 36 delays packet transmissions until detecting a 1-valued selectOut signal from the final memory module 34 in the daisy chain. Although the present invention has been described as being employed with DRAMs, it should be understood tat any type of memory module may be employed, e.g., read only memory device (ROMs), programmable read only memory device (PROMs), and the like. The scope of the invention should, therefor, be determined not with reference to the above description, but instead should be determined with reference to the appended claims along with their full scope of equivalents.

PATENT
Attorney Docket No. 17938-000110

**BIFURCATED DATA AND COMMAND/ADDRESS COMMUNICATION BUS
ARCHITECTURE FOR RANDOM ACCESS MEMORIES EMPLOYING
SYNCHRONOUS COMMUNICATION PROTOCOLS**

APPENDIX A

22

Draft 0.99 IEEE P1596.7-199X

Draft Standard for A High-Speed Memory Interface (SyncLink)

Sponsor

**Microprocessor and Microcomputer Standards Subcommittee
of the
IEEE Computer Society**

Not Yet Approved by the

IEEE Standards Board

Abstract: The SyncLink standard specifies a high-bandwidth interface optimized for interchanging data between a memory controller and one or more dynamic RAMs. SyncLink adapts RamLink (IEEE Std 1596.4-1996) protocols to tightly controlled RAM arrays with constrained layouts, where bus-based technology is feasible and appropriate. SyncLink is an applicable interface for other RAM-like devices as well.
Keywords: SyncLink, RamLink, memory bus, high-bandwidth, interface, dynamic RAMs, RAM This is an unapproved draft of a proposed IEEE Standard, subject to change. Permission is hereby granted for IEEE Standards Committee participants to reproduce this document for purposes of IEEE standardization activities. If this document is to be submitted to ISO or IEC, notification shall be given to the IEEE Copyright Administrator. Permission is also granted for member bodies and technical committees of ISO and IEC to reproduce this document for purposes of developing a national position. Other entities seeking permission to reproduce this document for standardization or other activities, or to reproduce portions of this document for these or other uses must contact the IEEE Standards Department for the appropriate license. Use of information contained in this unapproved draft is at your own risk.

Copyright © 1996 by the Institute of Electrical and Electronics Engineers, Inc.
345 East 47th Street, New York, NY 10017-2394, USA IEEE Standards Department
Copyright and Permissions
445 Hoes Lane, P.O. Box 1331
Piscataway, NJ 08855-1331, USA

23

IEEE Standards documents are developed within the Technical Committees of the IEEE Societies and the Standards Coordinating Committees of the IEEE Standards Board. Members of the committees serve voluntarily and without compensation. They are not necessarily members of the Institute. The standards developed within IEEE represent a consensus of the broad expertise on the subject within the Institute as well as those activities outside of IEEE that have expressed an interest in participating in the development of the standard.

Use of an IEEE Standard is wholly voluntary. The existence of an IEEE Standard does not imply that there are no other ways to produce, test, measure, purchase, market, or provide other goods and services related to the scope of the IEEE Standard. Furthermore, the viewpoint expressed at the time a standard is approved and issued is subject to change brought about through developments in the state of the art and comments received from users of the standard. Every IEEE Standard is subjected to review at least every five years for revision or reaffirmation. When a document is more than five years old and has not been reaffirmed, it is reasonable to conclude that its contents, although still of some value, do not wholly reflect the present state of the art. Users are cautioned to check to determine that they have the latest edition of any IEEE Standard.

Comments for revision of IEEE Standards are welcome from any interested party, regardless of membership affiliation with IEEE. Suggestions for changes in documents should be in the form of a proposed change of text, together with appropriate supporting comments.

Interpretations: Occasionally questions may arise regarding the meaning of portions of standards as they relate to specific applications. When the need for interpretations is brought to the attention of IEEE, the Institute will initiate action to prepare appropriate responses. Since IEEE Standards represent a consensus of all concerned interests, it is important to ensure that any interpretation has also received the concurrence of a balance of interests. For this reason IEEE and the members of its technical committees are not able to provide an instant response to interpretation requests except in those cases where the matter has previously received formal consideration.

Comments on standards and requests for interpretations should be addressed to:

Secretary, IEEE Standards Board
445 Hoes Lane
P.O. Box 1331
Piscataway, NJ 08855-1331
USA IEEE Standards documents are adopted by the Institute of Electrical and Electronics Engineers without regard to whether their adoption may involve patents on articles, materials, or processes. Such adoption does not assume any liability to any patent owner, nor does it assume any obligation whatever to parties adopting the standards documents.

Copyright ©1996 IEEE
This is an unapproved IEEE Standards Draft, subject to change.

24

Introduction (This introduction is not a part of IEEE P1596.7-199X, DRAFT Standard for A High-Speed Memory Interface (SyncLink).)

Comments on this draft or questions on the status of the SyncLink Working Group should be addressed to the Working Group chair:

Bill Vogley
MOS Memory
Texas Instruments Semiconductor Group
12201 Southwest Freeway
P.O. Box 1443, MS 692
Houston, Texas 77001
Phone: 713-274-3894
Fax: 713-274-3896
E-mail:W-Vogley@ti.com Questions on other Scalable Coherent Interface projects should be addressed to the Chair of the IEEE Std 1596-1992 Working Group:

Dr. David B. Gustavson
*SCIzzL*
Santa Clara University
Department of Computer Engineering
1946 Fallen Leaf Lane
Los Altos, CA 94024-7206
Phone: 415-961-0305
Fax: 415-961-3530
Email: dbg@SCIzzl Copyright ©1996 IEEE
This is an unapproved IEEE Standards Draft, subject to change.

25

Committee Membership

The following is a list of participants in the IEEE Project 1596.x Working Group. Voting members at the time of publication are marked with an asterisk (*).

Bill Vogley, *Chair**
*Vice Chair**
David B. Gustavson, *Editor**
*Secretary**

| | | |
|---|---|---|
| Larry Alchesky | David B. Gustavson | Rich Roy |
| Duane L. Anderson | Aidan Herbert | Kevin Ryan |
| Mathew Arcoleo | Michael Jahed | Earl E. Rydell |
| Harrison Beasley | David James | Robert J. Safranek |
| Robert W. Beauchamp | Anatol Kaganovich | Jim Schroeder |
| Tim Boggess | Stefanos Kaxiras | Tim Scott |
| Haakon O. Bugge | Khan Kibria | Hiroshi Shimada |
| Sam Calvin | Ralph Lachenmaier | Jim Sogas |
| Sam Chen | Gary Lesmeister | Joanne Spiller |
| Peter Cheng | Qiang Li | Glen D. Stone |
| Vang Cheong | Bill Van Loo | Atsushi Sukeno |
| T.C. Chou | Robert H. Macdonald | Farhad Tabrizi |
| Adrian B. Cosoroaba | Alberto Magnani | V.I. Vinogradov |
| James R. Bob Davis | John R. Mick | Bill Vogley |
| Martin Davis | Allan Mormann | Terry Walther |
| Guenter Ehret | James Nelson | Wen-Hann Wang |
| Richard C. Foss | Cormac O. Connell | Phil J. Whitney |
| Stein Gjessing | James Y. Park | Hans A. Wiggers |
| Jim Goodman | Earnest Powell | Danny Yeung |
| John Griffith | Bob Proebsting | Eddie T.S. Yim |
| Radhika Grover | Steven Przybylski | Andy Yu |
| | Mian Quddus | |

Copyright ©1996 IEEE
This is an unapproved IEEE Standards Draft, subject to change.

The following persons were on the balloting committee that approved this document for submission to the IEEE Standards Board:

27

When the IEEE Standards Board approved this standard on Month dd, 199x, it had the following membership:
*(this is a template for inserting the valid names when the standard is approved).*

A. Good Person, *Chair*　　　　　　　　　　　　　　　Alternate B. Him, *Vice Chair*
R. Dear Scribe, *Secretary*

Silja Theresa　　　　　　　Spencer David　　　　　　　Barbara Granse*

*Member Emeritus

Also included are the following nonvoting IEEE Standards Board liaisons:

How R. You
Eye M. Fine

Mary Lynne Nielsen
*IEEE Standards Project Editor*

Copyright ©1996 IEEE
This is an unapproved IEEE Standards Draft, subject to change.

Contents

| CLAUSE | PAGE |
|---|---|
| 1. Overview | 1 |
|     1.1 Scope | 1 |
|     1.2 Purpose | 1 |
|     1.3 Document structure | 2 |
|     1.4 Objectives | 2 |
|     1.5 Differences from RamLink | 3 |
|     1.6 Expected application | 4 |
|     1.7 Scheduling parallelism | 5 |
|     1.8 Configuration ROMs | 6 |
| 2. References | 7 |
| 3. Definitions and notation | 9 |
|     3.1 Conformance levels | 9 |
|     3.2 Definitions of RAM and interconnect-related terms | 9 |
|     3.3 Bit and byte ordering within packets | 11 |
|     3.4 Field notation (italic and bold usage) | 12 |
|     3.5 Numerical values | 12 |
| 4. SyncLink configurations | 15 |
|     4.1 SyncLink links | 15 |
|     4.2 Simple topologies | 15 |
|     4.3 DRAM error-checking options | 16 |
|     4.4 Error-checking | 17 |
| 5. SyncLink operation | 19 |
|     5.1 SyncLink addressing | 19 |
|     5.2 SyncLink address space | 20 |
|     5.3 Address errors | 21 |
|     5.4 SyncLink transactions | 21 |
|     5.5 Refresh operations | 24 |
| 6. Packet formats | 27 |
|     6.1 Packet components | 27 |
|     6.2 DataLink packets | 27 |
|     6.3 Command/address packet formats | 28 |
|     6.4 Sync packet | 31 |
|     6.5 Read request packet | 31 |
|     6.6 Load packet | 31 |
|     6.7 Write request packet | 32 |
|     6.8 WriteSync packet | 32 |
|     6.9 Store packet | 32 |
|     6.10 Event packet | 33 |
|     6.11 CloseRow | 34 |

Copyright © 1996 IEEE
This is an unapproved IEEE Standards Draft, subject to change.

| CLAUSE | PAGE |
|---|---|
| 7. SyncLink initialization and control | 35 |
|     7.1 ShutOff (or powerUp) recovery | 35 |
|     7.2 Self test and initialize | 38 |
|     7.3 Control registers | 38 |
|     7.4 Status registers | 38 |
| 8. SyncLink signals | 41 |
|     8.1 SyncLink connectivity | 41 |
|     8.2 SyncLink signal synchronization | 42 |
|     8.3 Special linkOn considerations | 43 |
|     8.4 SyncLink reduced-power modes | 43 |
|     8.5 Selecting external PROM | 46 |

ANNEX

| | | |
|---|---|---|
| A. | Bibliography | 47 |
| B. | Address Decoding | 49 |
| C. | Performance Model | 53 |

Figures

Figure 1:
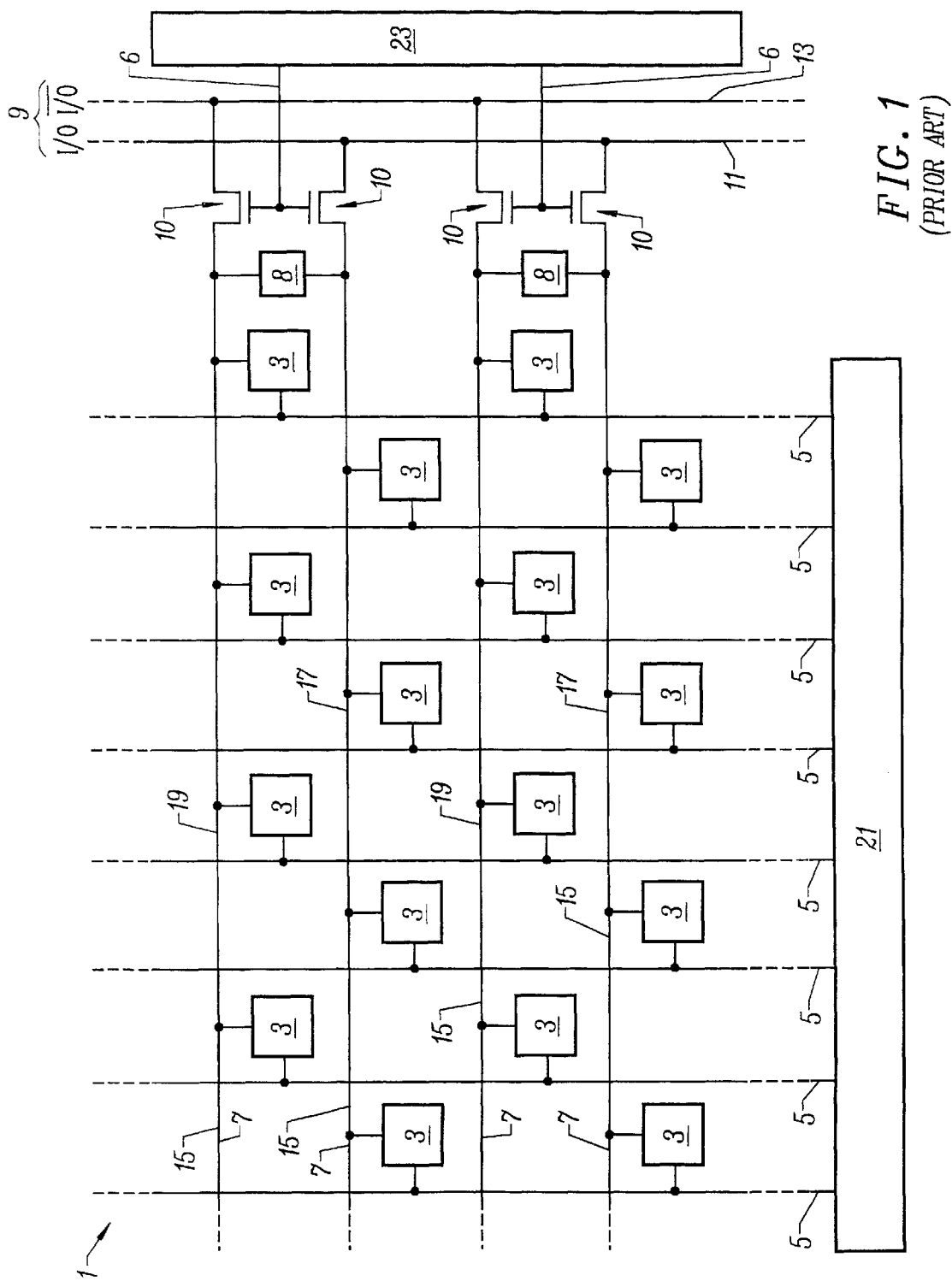
FIG. 1 is a block diagram of a prior art computer memory device disclosed in FIG. 1 of U.S. Pat. No. 5,307,314.
Figure 6:
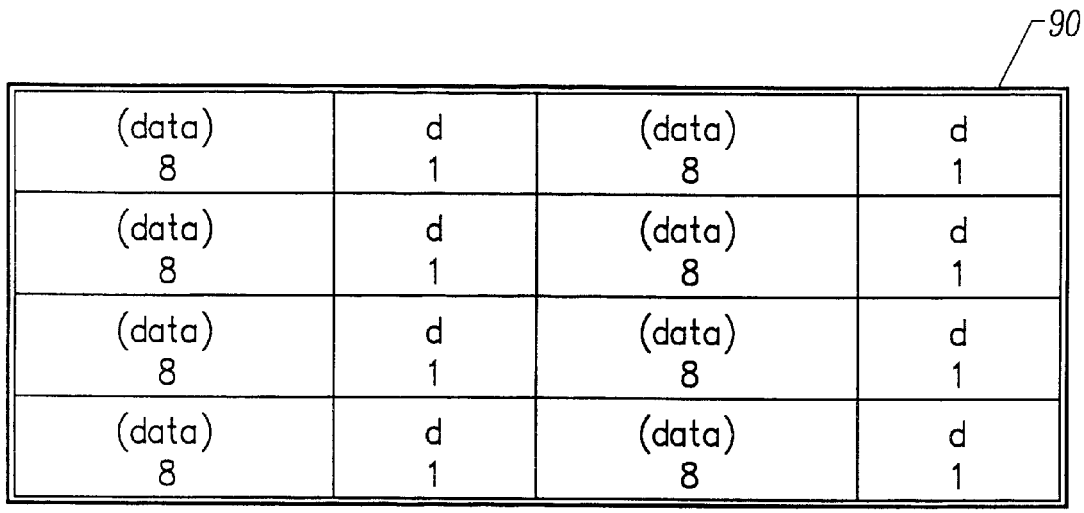
FIG. 6 is a schematic view showing a data packet employed to transfer data information between a controller and memory modules, shown in FIG. 1.
Figure 8:
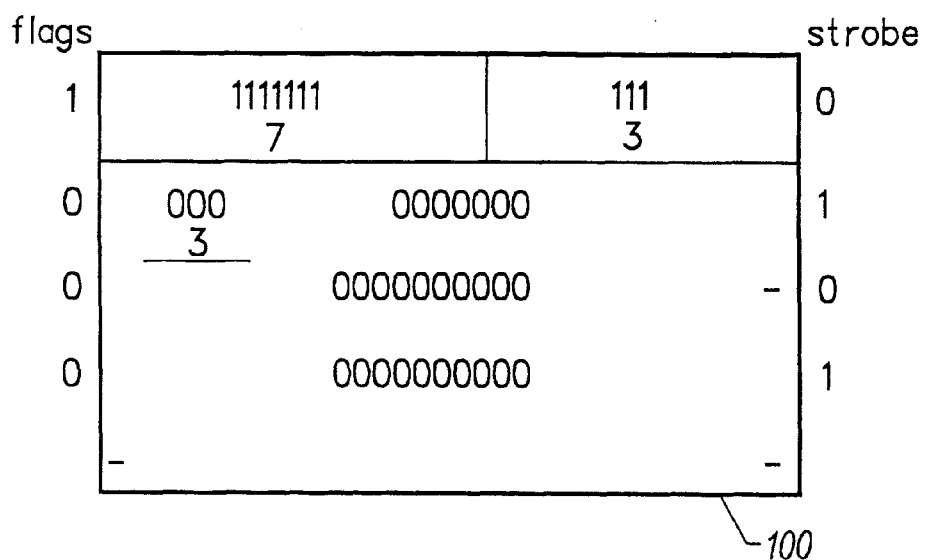
FIG. 8 is a schematic view showing an information packet associated with a Sync protocol employed to adjust the transfer rate of control and address information between a controller and memory modules, shown in FIG. 1.
Figure 9:
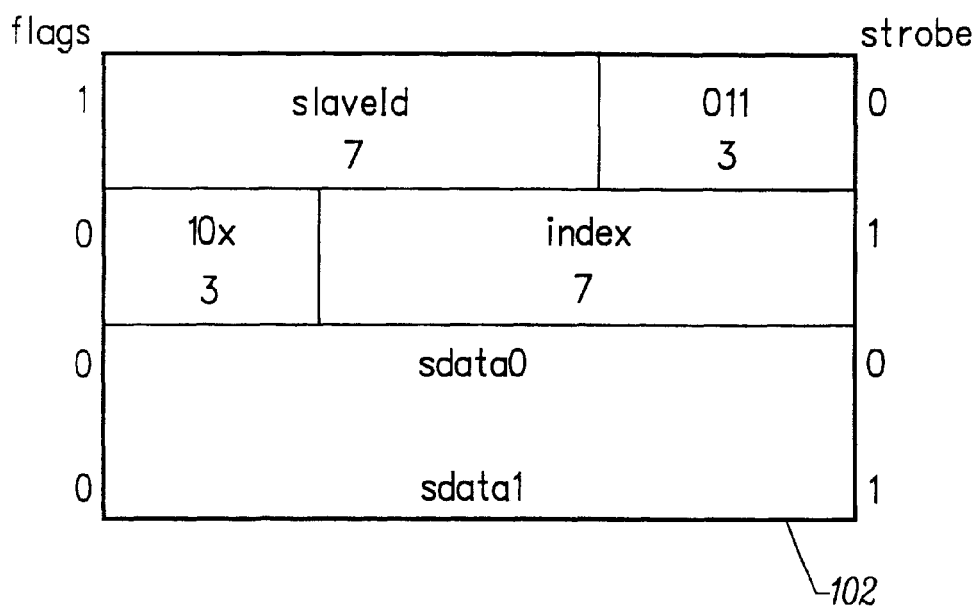
FIG. 9 is a schematic view showing an information packet associated with a Store protocol employed to facilitate communication of control information between a controller and memory modules, shown in FIG. 1.
Figure 10:
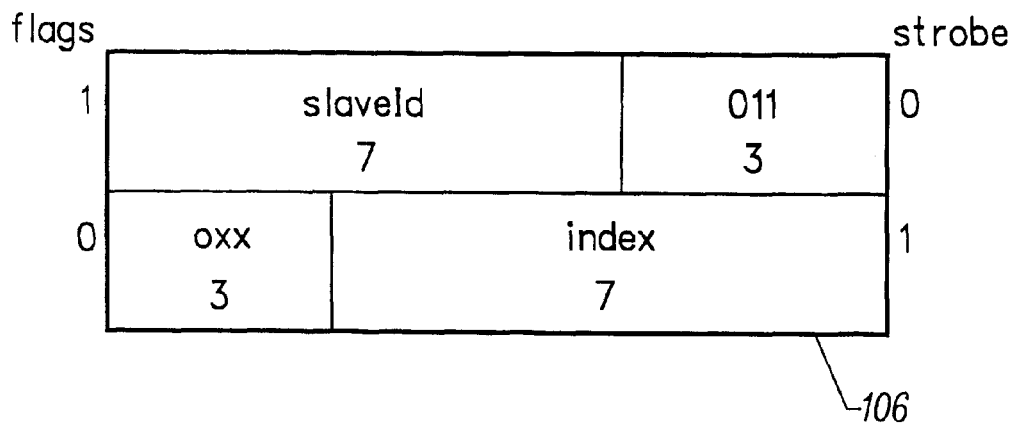
FIG. 10 is a schematic view showing an information packet associated with a Load protocol employed to facilitate a controller reading status information in the memory modules, shown in FIG. 1.
Figure 11:
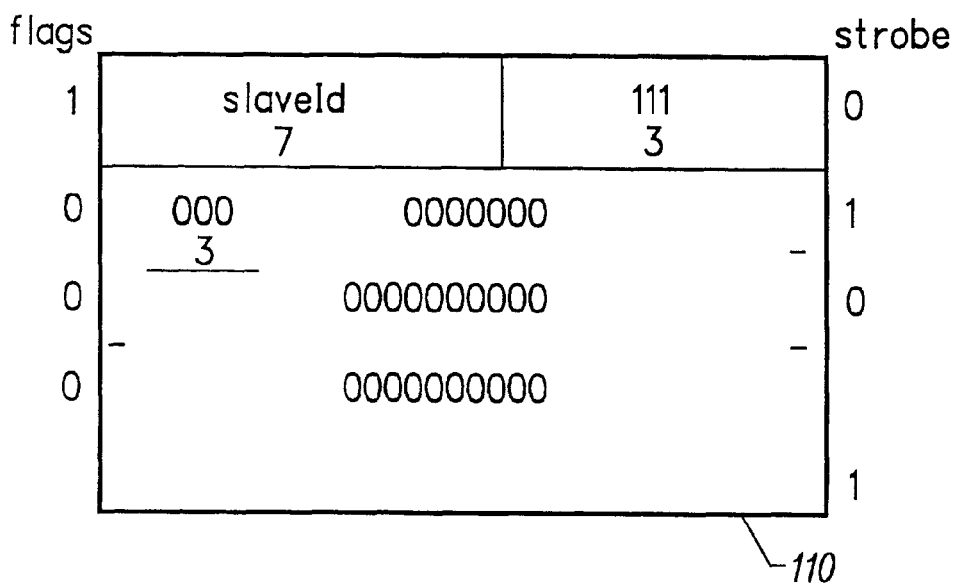
FIG. 11 is a schematic view showing an information packet associated with a write Sync protocol employed to adjust the transfer rate of data information between a controller and memory modules, shown in FIG. 1.

| FIGURE | | PAGE |
|---|---|---|
| Figure 1— | PC-class memory systems | 4 |
| Figure 2— | Primary memory-access traffic model | 5 |
| Figure 3— | Secondary memory-access traffic model | 5 |
| Figure 4— | Scheduled sub-RAM components | 5 |
| Figure 5— | Module-configuration ROM access | 6 |
| Figure 6— | Byte ordering within packets on commandLink | 12 |
| Figure 7— | Byte ordering within packets on dataLink | 12 |
| Figure 8— | A small SyncLink layout | 15 |
| Figure 9— | Logical SyncLink topology | 15 |
| Figure 10— | A typical small-system design | 16 |
| Figure 11— | Controller circuitry, 16-bit-wide RAM | 17 |
| Figure 12— | Controller ECC circuitry, 18-bit-wide RAM | 17 |
| Figure 13— | Various SLDRAM configurations | 19 |
| Figure 14— | chipSelect signal usage | 20 |
| Figure 15— | SyncLink address space partitioning | 21 |
| Figure 16— | Read transaction | 22 |
| Figure 17— | Write transaction | 23 |
| Figure 18— | Command/address packet framing | 27 |
| Figure 19— | Idle bytes format | 27 |
| Figure 20— | Data packet format | 28 |
| Figure 21— | Command/address packet components | 28 |
| Figure 22— | Sync packet format | 31 |
| Figure 23— | Read request packet format | 31 |
| Figure 24— | Load packet format | 32 |
| Figure 25— | Write request packet format | 32 |
| Figure 26— | WriteSync packet format | 32 |
| Figure 27— | Store packet format | 33 |
| Figure 28— | Event command | 33 |
| Figure 29— | CloseRow packet format | 34 |
| Figure 30— | Effect of resetHard | 35 |
| Figure 31— | Initial slaveId assignments | 35 |
| Figure 32— | Final slaveId assignments | 36 |
| Figure 33— | selectIn/selectOut daisy chain through modules | 37 |
| Figure 34— | SyncLink interconnect signals | 41 |
| Figure 35— | A simple SyncLink topology | 42 |
| Figure 36— | SLDRAM synchronization design model | 43 |
| Figure 37— | LinkOn driver/termination model | 43 |
| Figure 38— | StandBy timing | 44 |
| Figure 39— | ShutDown entrance timing | 44 |
| Figure 40— | ShutDown initiation timing | 45 |
| Figure 41— | ShutDown recovery timing | 46 |
| Figure 42— | Complete chipSelect decoding logic | 50 |
| Figure 43— | Partial chipSelect decoding logic | 51 |
| Figure 44— | Performance considerations | 54 |

Copyright © 1996 IEEE
This is an unapproved IEEE Standards Draft, subject to change.

| TABLE | | PAGE |
|---|---|---|
| Table 1— | SlaveId values (first field) | 28 |
| Table 2— | Command and Subcommand Encoding | 30 |
| Table 3— | Event index codes | 33 |
| Table 4— | Control registers | 38 |
| Table 5— | Status registers | 39 |
| Table 6 — | Multicast slaveId addresses | 49 |

32

DRAFT Standard for A High-Speed Memory Interface (SyncLink)

1. Overview

1.1 Scope

This document represents an application and adaptation of the protocols developed for use in the RamLink standard, which was designed for use in extended I/O and memory systems, to purely memory systems based on tightly controlled physical layout and electrical properties. It specifies a packet-based interface for cost-effective communication between a memory controller and one or more dynamic memory chips. Rather than using the formal document title, "DRAFT Standard for A High-Speed Memory Interface (SyncLink)," the informal term *SyncLink* is used to refer to this standard. The scope and purpose of this activity are defined by the project's authorization request, from which the following scope and purpose statements have been extracted:

> Scope: To define a protocol (based on RamLink), electrical signaling, and mechanical packaging, optimized for interconnecting DRAM (Dynamic Random Access Memory) within a memory system.

The main scope of the work is aimed at applying an optimized subset of the RamLink logical protocols to a RAM environment that uses carefully specified and controlled bus-based connections. Support for I/O devices or other non-RAM devices is given lower priority than in the RamLink standard, but such applications are not precluded.

1.2 Purpose

> Purpose: As memories continue to rapidly increase in density, we are approaching the point where the capacity of DRAM packages is not well matched to their applications; i.e., one needs a certain number of chips to get the bandwidth the system requires, and that many chips provides an unreasonably large amount of memory for low-end but important high volume applications, like PCs and workstations. To solve this problem, one must increase the bandwidth of the DRAM package significantly, so that the number of devices is not driven by the bandwidth need, but by system memory requirements. SyncLink will provide cost-effective high performance with a small number of DRAM devices by improving bandwidth per I/O pin.

When lower-density DRAM chips were 1 bit wide, additional memory-access bandwidth was achieved by connecting multiple DRAMs in parallel, so that a 16-bit, 32-bit, or even 64-bit word could be obtained in a single memory-access cycle. As memory densities have increased, the need to access a video image every refresh cycle has been met by increasing the memory-chip interface widths, to 4-bit, 8-bit, 16-bit, and even 32-bit widths. A single chip can provide sufficient storage for holding a video image or an operating system, if the access-bandwidth requirements can be met.

By increasing the memory component bandwidths, SyncLink is expected to decrease the costs of small systems, where the minimum number of memories is driven by the system's bandwidth (not storage size) requirements. The protocols are intended to be technology independent, in that the assumed memory con- Copyright ©1996 IEEE
This is an unapproved IEEE Standards Draft, subject to change.

troller could be integrated with the processor on small systems or (on large systems) could efficiently interface to a variety of system buses.

The strategy adopted by SyncLink to accomplish this includes reducing the number of feature options supported. Only a few burst transfer sizes are defined, and no byte-selects for partial word writes are provided; thus partial writes are done by the controller using a read/modify/write sequence, so the controller is the natural place to handle ECC if that is desired.

A strictly fixed timing was adopted, so that pipeline techniques can be used to optimize SLDRAM performance. As a result, leaving a row open has little speed advantage, but it can be used to save power during read/modify/write sequences. In the case of an access to an open row where pipeline scheduling does not conflict, e.g. after a brief lull, a shortcut transaction is provided that skips the unneeded pipeline stages, providing the shortest possible latency.

The SyncLink design eliminates the need for chipSelect signals, which simplifies layout and control.

1.3 Document structure

The SyncLink specification is partitioned into clauses that serve several distinct purposes.

Clause 1: Overview provides background for understanding the goals and objectives of this document.

Clause 2: References lists the references used in the remainder of this document.

Clause 3: Definitions and notation describes the terminology and notation used in the remainder of this document.

Clause 4: SyncLink configuration describes the SyncLink topology.

Clause 5: SyncLink operation describes the various SyncLink operations, including split-response transactions.

Clause 6: Packet formats specifies the formats of SyncLink packets.

Clause 7: SyncLink initialization specifies protocols and timing for power-on and reduced-power modes of operation (shutdown and standby).

Clause 8: SyncLink signaling describes the SyncLink physical signaling standard, consisting of shared input and output links, which is optimized for short-distance PC-board-local communications.

Annex A: Bibliography provides pointers to related standards and other useful documents.

1.4 Objectives

SyncLink is intended to be an interconnect standard that is well suited to memory arrays. The following objectives were assumed or developed during the development of this standard and have heavily influenced the design options that were selected.

- a) *Commodity parts.* The SyncLink interface should be applicable to a majority of future DRAM applications.
- b) *Predictable timing.* The SyncLink interface should allow memory controllers to schedule the responses for multiple concurrently active requests.

c) *Device flexibility.* In addition to supporting DRAMs, the SyncLink interface should support other RAM-like components, if they emulate the characteristics of RAM-chip components, including (but not limited to):
   1) ROM and FLASH memories.
   2) High-bandwidth I/O devices.
   3) Bridges to other interconnect systems, such as SCI.

It should be emphasized that the primary goal of SyncLink is to support low-cost commodity SLDRAM parts (objective a). The support of other devices (objective c) should be consistent with this goal; thus device and bridge interfaces should be sufficient but may be suboptimal.

To meet these objectives, the following design strategy was used:

a) *SLDRAM simplicity.* Whenever possible, complexity should be located in the controller rather than in the memory chips.
b) *Interoperable speeds.* Mixed-speed DRAM components can be supported by a simple controller that assumes the slowest DRAM access time for all.

The scope of the SyncLink definition is consistent with this strategy, leveraging physical layers and packet formats developed by others, as described below:

a) *Protocols.* The SyncLink interface uses RamLink-like protocols to communicate between a controller and one or more memory devices.
b) *Electrical signals.* The SyncLink interface specifies signals used to communicate between the controller and one or more SLDRAMs. However, other standards are referenced for detailed signal levels and timing characteristics.
c) *Physical packaging.* The SyncLink interface does not specify physical packaging requirements. Other standards groups, such as JEDEC, are expected to define physical-packaging standards based on market requirements.

1.5 Differences from RamLink

Because of the increased optimization for RAM applications and the reduced emphasis on I/O interfaces, a number of evolutionary changes have been made from the RamLink protocols to improve efficiency and take full advantage of the bus-style connections used by SyncLink. These include:

a) *No status.* The SyncLink responses do not include any status information. In the rare cases where status is needed, it must be saved within the SLDRAM chip for subsequent readout via special registers.
b) *Exact scheduling.* The mechanism in RamLink that allowed for responses to be returned earlier than the scheduled time has been eliminated.
c) *No retry.* SyncLink scheduling is always exact, and there is no mechanism for the SLDRAM chip to request a retry, e.g., due to an unexpected conflict between refresh and access.
d) *No response header.* Response packets only occur when scheduled, so need not identify themselves to the controller. Bandwidth is saved by eliminating the header entirely, and the status information. Thus responses only occur for reads and only contain data.
e) *No self refresh.* To make the scheduling fully predictable, eliminate the need for retry, and simplify the SyncLink design, self refresh is not supported during normal operation, though it is expected to be used while in low-power standby (shutDown) modes.
f) *Compact commands.* To improve efficiency, the request-packet headers have been reduced to the minimum necessary for SLDRAM applications.

Copyright © 1996 IEEE
This is an unapproved IEEE Standards Draft, subject to change.

g) *Simplified device model.* SyncLink RAMs are not expected to have internal request or response queues, but merely to handle one request and one response per block. Multiple blocks have the same read/write timing as independent SLDRAM devices.

1.6 Expected application

The primary application of SyncLink technology is to connect the memory controller to a small number of inexpensive RAMs, as illustrated in figure 1.

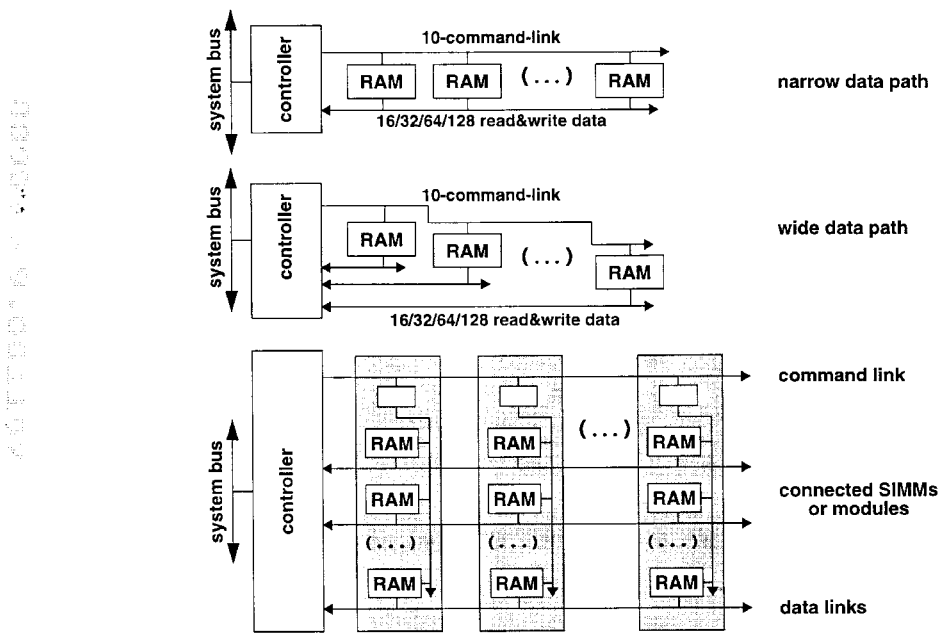

Figure 1—PC-class memory systems

For larger, and higher performance, applications, multiple links are expected to be used to improve the total available bandwidth (for large transfers), to reduce the average latency (for small, interleaved transfers), or to improve the system reliability.

Reliable systems are expected to store redundant data copies, so that the data can be recovered after part of the memory array fails. Standard RAID (redundant arrays of independent disks) techniques can be applied to such memory topologies. For example, a memory controller might support five arrays: four would be used for saving interleaved copies of the data and the fifth would be used to store a parity-check copy.

Traffic patterns on such systems are hard to predict. However, several likely processor-to-memory access patterns were considered.

A cached processor is expected to generate cache-line accesses, which are here presumed to be 64 bytes. With a write-back cache, there are approximately three times as many reads as writes. All transactions transfer a cache line of data (64 bytes). This is the expected case for which the SyncLink design is optimized, illustrated in figure 2.

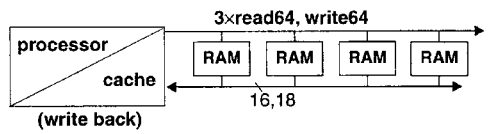

Figure 2—Primary memory-access traffic model

An uncached processor is expected to generate word accesses (where a "word" is either 4 or 8 bytes) with approximately three times as many reads as writes. This memory-traffic model, illustrated in figure 3, was considered to be of secondary importance for optimizing the SyncLink design. Short writes in SyncLink involve reading a burst, modifying the written portion of the data, and writing the burst back. This might seem suboptimal for the simplest memory systems, but it simplifies and speeds the memory control and access significantly, so the performance of the lowest-end systems is better than one might expect, while the performance of more typical caching systems is significantly improved.

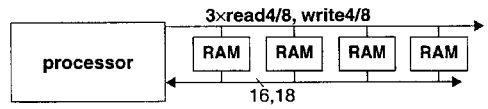

Figure 3—Secondary memory-access traffic model

1.7 Scheduling parallelism

A SyncLink RAM device may have multiple subRAMs or *blocks*, as illustrated in figure 4. Except for initialization, which is at least partly a node (device) function, the blocks act essentially like independent RAMs. SyncLink blocks are not expected to have general multiple-entry request queues, as was assumed for RamLink, but are expected to handle one request at a time.

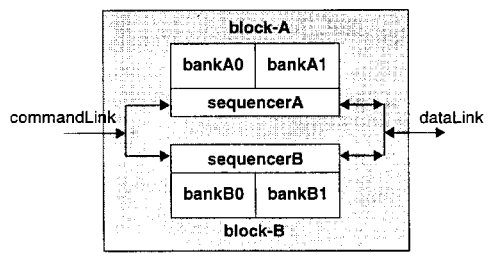

Figure 4—Scheduled sub-RAM components

Banks contain rows, and rows contain columns. A row is the amount of data read or written to one of the chip's internal storage arrays. Columns are the subsets of rows that are read or written in individual read or write operations as seen by the chip interface. For example, if the data path to the chip is 16 bits wide at the package level, each 16-bit subset of the current row is connected to the I/O pins as a column access within that row. A typical data transfer in SyncLink concatenates four 16-bit columns to make a data packet. Accessing columns within the same row is faster than accessing another row, saving the row access time required to bring the row of data from the actual RAM storage cells.

Multiple banks within each subRAM can provide an additional level of parallelism. With multiple banks, data can often be reused (from an open row in each bank) to improve performance.

To summarize, a bank corresponds to a row that may be held ready for multiple accesses; a subRAM corresponds to one or more banks sharing one timing controller that can perform only one operation at a time; a RAM corresponds to multiple subRAMs that can access data concurrently, but which share initialization and addressing facilities as well as package pins and some internal datapaths. Multiple RAMs sharing one controller comprise a memory subsystem.

SLDRAMs shall have at least 16 independent banks.

1.8 Configuration ROMs

PROMs of various kinds may be used to provide configuration information in SDRAM modules, as illustrated in figure 5.

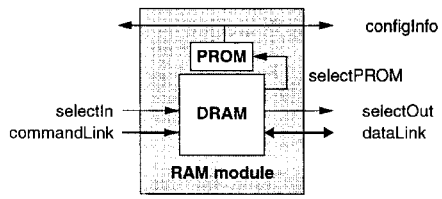

Figure 5—Module-configuration ROM access

The 1/0 selectIn/selectOut indication can be used to simplify addressing.

Advantages include the following.

a) Simplified DRAM
 b) Not provided when not needed
 c) Post-tester values (such as speed) easily incorporated Draft 0.99 October 14, 1996
Memory Interface (SyncLink)

IEEE
P1596.7-199X

2. References

The following documents shall be used in conjunction with this standard:

IEEE Std 1596.4-1996, Standard for Memory Interface based on SCI (RamLink), which is hereby incorporated by reference in its entirety for all purposes.

The term "SyncLink" appears in IEEE Std 1596.4-1996. However, the term "SyncLink" as used in this draft standard P1596.7-199X has a different meaning than the term "SyncLink" as used in IEEE Std 1596.4-1996.

Copyright ©1996 IEEE
This is an unapproved IEEE Standards Draft, subject to change.

IEEE
P1596.7-199X

Draft 0.99 October 14, 1996
DRAFT Standard for A High-Speed

Copyright ©1996 IEEE
This is an unapproved IEEE Standards Draft, subject to change.

Draft 0.99 October 14, 1996  
Memory Interface (SyncLink)

IEEE  
P1596.7-199X

3. Definitions and notation

3.1 Conformance levels

Several key words are used to differentiate among different levels of requirements and options, as follows:

3.1.1 expected: A key word used to describe the behavior of the hardware or software in the design models assumed by this standard. Other hardware and software design models may also be implemented.

3.1.2 may: A key word that indicates flexibility of choice with no implied preference.

3.1.3 shall: A key word indicating a mandatory requirement. Designers are required to implement all such mandatory requirements to ensure interoperability with other standard-conformant products.

3.1.4 should: A key word indicating flexibility of choice with a strongly preferred alternative. Equivalent to the phrase "it is recommended."

3.2 Definitions of RAM and interconnect-related terms

A large number of RAM and interconnect-related technical terms are used in this document. These terms are described below:

3.2.1 addressed refresh: A RAM-refresh protocol, in which the controller-provided read0-requests schedule the timing and specify addresses for RAM refresh cycles. No longer recommended, as this tends to result in dependence on vendor-specific behaviors.

3.2.2 autorefresh: A RAM-refresh protocol in which controller-provided *refreshNow* signals schedule the timing for RAM refresh cycles and RAM-local hardware specifies refresh-cycle addresses. This corresponds to CBR, CAS Before RAS, in DRAMs.

3.2.3 bank: A RAM array (now usually a fraction of a RAM chip) that has its own sense amplifiers and row-storage buffer.

3.2.4 block: One or more banks of RAM with their shared timing control, here presumed not to permit concurrent *read* and *write* access because of shared internal paths. Several blocks may be packaged together for form one RAM chip or package. These blocks, or subRAMs, are functionally independent except for initialization.

3.2.5 byte: A set of signals or bits accessed as a unit. Usually 8 bits. In this document, data transfers may be multiples of 8 or 9 bits wide.

3.2.6 cache line: Often called simply a "line." The block of memory (sometimes called a sector) that is managed as a unit for coherence purposes; i.e., cache tags are maintained on a per-line basis. Although the SCI line size influenced the SyncLink packet sizes, coherence protocols are beyond the scope of this standard.

3.2.7 column: Subset of a row, usually the width of the I/O pins on the device so that data are transferred one column at a time.

3.2.8 commandLink: The bus carrying addresses and commands from the controller to the SLDRAM devices.

Copyright © 1996 IEEE  
This is an unapproved IEEE Standards Draft, subject to change.

41

3.2.9 controller: The entity that initiates SyncLink transactions. There is exactly one controller on each SyncLink link.

3.2.10 dataLink: The bidirectional bus carrying data between the SLDRAM devices and the controller.

3.2.11 directed transaction: A transaction that is processed by one and only one responder. The read and write transactions are always directed; the event transactions may be directed or broadcast.

3.2.12 doublet: Two bytes of data.

3.2.13 ECC: See error correction coding.

3.2.14 error correction coding: An encoding of data and redundant check bits that enables decoding hardware to reconstruct the original data in the presence of a data-bit or check-bit error.

3.2.15 EDC: See error detection coding.

3.2.16 error-detection coding: An encoding of data and redundant check bits, such that in the presence of a data-bit or check-bit error decoding hardware can detect the error, but cannot reconstruct the original data.

3.2.17 event, event command: A command contained within an event packet.

3.2.18 event packet: A packet containing an event command that is directed to one SLDRAM or broadcast to all. Device state is affected by the event command, but no response is returned to the controller.

3.2.19 initialization packet: Special packets that are only generated by the controller during the SyncLink initialization process.

3.2.20 line: See "cache line."

3.2.21 JTAG: An abbreviation for "Joint Test Activity Group" that is used to describe the serial diagnostic signals that have been defined by that standards body.

3.2.22 Mbit: A synonym for $2^{20}$ bits.

3.2.23 Mbyte: A synonym for $2^{20}$ bytes.

3.2.24 node: A term used to describe an SLDRAM within the context of the CSR Architecture. A node is an entity associated with a particular set of control-register addresses (including identification ROM and reset-command registers). In normal operation each node can be accessed independently (a control-register update on one node has no effect on the control registers of another node).

3.2.25 octlet: Eight bytes of data. Not to be confused with an octet, which has been commonly used to describe eight bits of data. In this document, the term byte, rather than octet, is used to describe eight (or sometimes nine or ten) bits of data.

3.2.26 packet: A block of related information that is transmitted as sequential bytes.

3.2.27 quadlet: Four bytes of data.

3.2.28 RamLink: The packet-transfer architecture standard, IEEE Std 1596.4-1996, which describes how packets are transferred between one master and multiple slaves.

3.2.29 refresh: A periodic referencing of all storage locations in a DRAM, which typically recharges data-storage capacitors, in order to maintain data integrity.

3.2.30 refresh period: Applicable to RAM that is in the autorefresh mode. The maximum elapsed time between refresh commands that is sufficient to ensure that RAM contents remain defined.

3.2.31 request packet: A packet that is generated by a controller to initiate a directed transaction with a selected SLDRAM.

3.2.32 response packet: A packet that is generated by an SLDRAM to return data from an address specified by a previous request packet.

3.2.33 row: The bits fetched together in parallel from a memory array in a RAM device, latched in a wide register associated with the sense amplifiers of that array, and written back to the array as a unit for write operations or for refreshing the RAM contents. Once a row has been fetched and latched, which requires a time called the *row access* time, it is said to be *open*. Data from an open row can be brought to the RAM chip outputs very rapidly, in a *column access* time, which is normally much shorter than the row access time. Thus open rows are often used for speeding sequential accesses to data in that same row, as a small cache.

3.2.34 SCI: An abbreviation for IEEE Std 1596-1992 Scalable Coherent Interface.

3.2.35 shutDown: The lowest-power operating mode of SLDRAMs, where all signals except for a bused *linkOn* signal may be ignored.

3.2.36 shutOff: An unpowered state of SLDRAMs, where a drop in the supply voltage may have caused a loss of volatile memory state. The contents of DRAM storage become undefined; storage on special RAM-like devices (such as FLASH memory) may be unaffected by the shutOff state.

3.2.37 slave: The entity that responds to SyncLink transactions (the transaction addressing is sufficient to support up to 63 slaves on each SyncLink shared link). Normally this is an SLDRAM.

3.2.38 SLDRAM: A SyncLink Dynamic Random Access Memory.

3.2.39 standBy: A lower-power operating mode of SLDRAMs, where a change in the *listen* line is sufficient to quickly reactivate attached chips.

3.2.40 SyncLink: A physical interconnect model, consisting of shared input and output links, based on the RamLink logical protocols. SyncLink is optimized for short-distance single-board communications using a bused connection.

3.2.41 sync packet: A packet typically generated when leaving shutdown (to synchronize the device receiver circuits).

3.2.42 tick: A time interval that is equal to the transmission time of one bit on any signal line of the link from the controller to the SLDRAM, the *commandLink*.

3.3 Bit and byte ordering within packets

SyncLink communication is performed by sending packets. Packet format illustrations specify the content of the data bytes as well as the values of the associated flag and clock (strobe) lines, as shown in figure 6 and figure 7.

IEEE  
P1596.7-199X

Draft 0.99 October 14, 1996  
DRAFT Standard for A High-Speed

```
              most significant bit      least significant bit
       flags  c0 c1 c2 c3 c4 c5 c6 c7 c8 c9   strobe
         1    |          first byte          |   0
         0    |         (other bytes)        |   1
         0    |       next-to-last byte      |   0
         0    |          last byte           |   1
```
increasing time ↓

Figure 6—Byte ordering within packets on commandLink

```
   a0 a1 a2 a3 a4 a5 a6 a7 a8   b0 b1 b2 b3 b4 b5 b6 b7 b8
   |     first byte     | p |     second byte    | p |
   |  next-to-last byte | p |      last byte     | p |
```
increasing time ↓

Figure 7—Byte ordering within packets on dataLink

The first-through-last bytes within a packet (as transmitted in time) are always the top-through-bottom bytes in the figure, respectively. The partitioning of the fields within data bytes is specified by the number of bits within each field, which are specified at the bottom of the packet. For the DRAM address, the first-through-last bytes are the most- through least-significant, respectively.

Within any data byte, the most-significant through least-significant bits are always the left-most through right-most bits. Although bit labels are not included in most illustrations, the left-most through right-most bits are to be labeled bit 0 through 7, respectively. Bytes on the commandLink have 10 bits.

This is a consistent big-endian data representation. Some designers are more comfortable using mixed notations (0 is the most-significant byte, but the least-significant bit). However, the use of consistent notation minimizes confusion when specifying the addresses of bit fields and multi-byte components that cross byte-address boundaries.

3.4 Field notation (italic and bold usage)

Fields within a packet or fields within a register are often illustrated in figures and described in text. Within the figures, a helvetica font is used and a normal font type (i.e. not italic) is used. When described within text, an italic font is used to describe a field, such as *tId*, to avoid confusion with surrounding English words. A bold font is used for emphasis on first use; the *tId* field would otherwise have a normal italic font.

3.5 Numerical values

Decimal, hexadecimal, and binary numbers are used within this document. For clarity, decimal numbers are generally used to represent counts, hexadecimal numbers are used to represent addresses, and binary numbers are used to describe bit patterns within binary fields.

Copyright ©1996 IEEE  
This is an unapproved IEEE Standards Draft, subject to change.

Draft 0.99 October 14, 1996  
Memory Interface (SyncLink)

IEEE  
P1596.7-199X

Decimal numbers are represented in their standard 0, 1, 2, ... format. Hexadecimal numbers are represented by a string of one or more hexadecimal digits (0-9,A-F) followed by the subscript 16, except in C-code contexts, where they are written as 0x123EF2, etc. Binary numbers are represented by a string of one or more binary digits (0,1), followed by the subscript 2. Thus the decimal number 26 may also be represented as $1A_{16}$ or $11010_2$.

When describing bit or byte quantities, the abbreviations of K, M, and G are used to represent powers of two, rather than powers of 10, as is the normal metric practice. Thus, 1Kbyte refers to $2^{10}$ (1024) bytes, 1Mbit refers to $2^{20}$ bits, and 1Gbyte refers to $2^{30}$ bytes.

Copyright ©1996 IEEE  
This is an unapproved IEEE Standards Draft, subject to change.

45

IEEE
P1596.7-199X

Draft 0.99 October 14, 1996
DRAFT Standard for A High-Speed

Copyright ©1996 IEEE
This is an unapproved IEEE Standards Draft, subject to change.

4. SyncLink configurations

4.1 SyncLink links

Two shared links (buses), a unidirectional *commandLink* and a bidirectional *dataLink*, are used to connect the controller to multiple slaves (typically SLDRAM memory chips), as illustrated in figure 8. The advantage of this compared to RamLink's RamRing signaling is reduced pin count. The disadvantage is poorer extensibility; high-speed buses such as these are only feasible when stubs are short and the overall length is short.

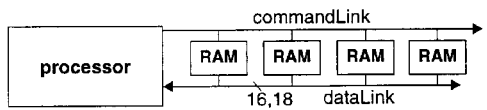

Figure 8—A small SyncLink layout

4.2 Simple topologies

SyncLink uses shared-link (bused) communication to achieve a simple *high-bandwidth* data-transfer path between a memory controller and one or more memory slaves. A SyncLink system consists of one controller and up to 64 SLDRAMs, as illustrated in figure 9.

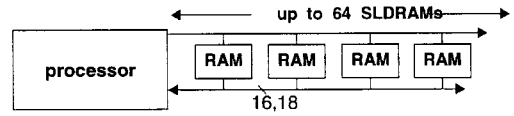

Figure 9—Logical SyncLink topology

Having only one controller on each SyncLink subsystem dramatically simplifies the initialization and arbitration protocols. Limiting each to 64 SLDRAMs simplifies the packet encoding, because the SLDRAM address, or *slaveId*, can be contained in the first byte of every packet. The limit is 64 rather than 128 because half of the 7-bit *slaveId*s are used for broadcast and multicast addresses. In practice, loading limits will reduce the useable size considerably.

The link from the controller to the SyncLink nodes, the *commandLink*, is unidirectional and the signal values can change every clock tick. The nominal clock period is physical-layer dependent (for a compact high-performance system, say 2.5 ns), but SyncLink changes data values on both edges of the clock (i.e., the data signals may change every 1.25 ns). For a 10-bit-wide commandLink, this example corresponds to raw bandwidth of 200 M command packets/s.

The basic 10-bit-wide *commandLink* contains fourteen signals: *linkOn* (a low-speed asynchronous initialization signal), a strobe (clock) signal, a *listen* signal that enables flag and data receivers, a flag signal, and ten data signals. The listen, flag, and data are source-synchronous, in that the incoming strobe signal indicates when the other input signals are valid. The flag signal marks the beginning of transmitted packets.

The data signals are used to transmit bytes within packets. Depending on the location within a packet, the bytes provide address, command, status, or data values.

IEEE  
P1596.7-199X
Draft 0.99 October 14, 1996  
DRAFT Standard for A High-Speed The *dataLink* is 16 or 18 bits wide, carrying read data from SyncLink nodes back to the controller or write data from the controller to one or more SyncLink nodes. The bit rate is the same as for the commandLink, and the minimum block transferred corresponds to 4 bits on each dataLink pin, the same duration as the command. The timing assumptions for the 2.5 ns clock period assumed in the example above result in 1600 MBytes/s on the dataLink.

The SyncLink architecture supports multiples of both 16-bit and 18-bit-wide DRAMs, allowing the marketplace to determine which is the most applicable. Note that 18-bit chips can be used by 16-bit controllers, since the extra bits are logically disconnected until enabled by a controller-initiated command.

A typical small system is shown in figure 10.

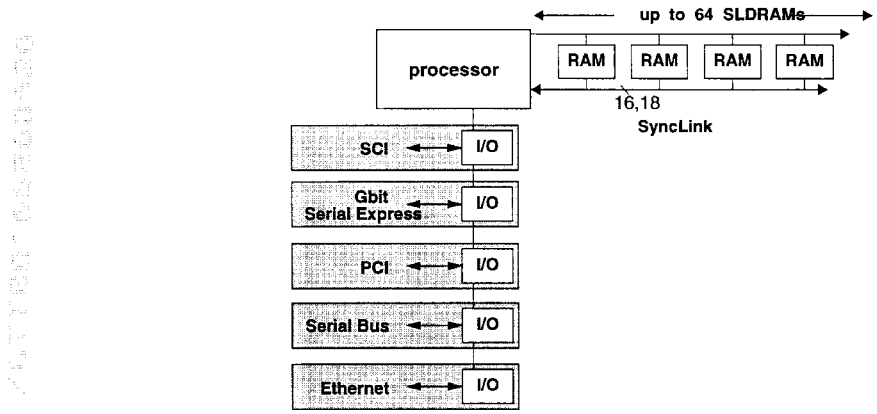

Figure 10—A typical small-system design

4.3 DRAM error-checking options

Some implementations are expected to provide error-correction circuitry (ECC), to correct single-bit soft and/or hard errors. SyncLink supports controller-based ECC implementation options.

4.3.1 Nonexistent ECC

Although less robust, not implementing ECC is the most efficient and the lowest-cost option, since 16-bit-wide RAMs are cheaper than 18-bit-wide RAMs. Such a system is illustrated in figure 11.

4.3.2 Controller-based ECC

The controller can implement ECC by using slightly larger RAMs and 18-bit-wide data-transfer paths. The controller reads bursts of multiples of 72-bit words, as illustrated in figure 12.

For small write transactions, controllers are expected to generate a read burst transaction, insert the modified data and regenerate the ECC, and generate a write burst transaction to return the updated data.

Copyright © 1996 IEEE  
This is an unapproved IEEE Standards Draft, subject to change.

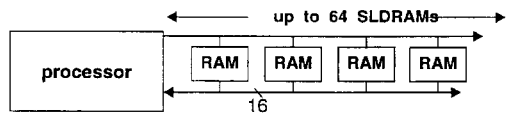

Figure 11—Controller circuitry, 16-bit-wide RAM

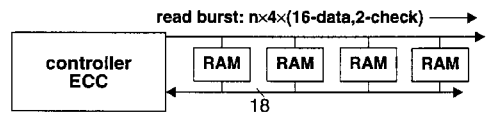

Figure 12—Controller ECC circuitry, 18-bit-wide RAM

Controller-based ECC protocols are less efficient for small (less than 8-byte) transfers and 18-bit-wide RAMs are expected to be relatively more expensive than their 16-bit counterparts. However, (when compared to on-RAM-chip ECC) the RAM-chip complexity is reduced by performing the ECC computations in the controller.

Note that 16-bit DRAMs can also be used for ECC by mapping the extra bits to an otherwise unused part of the DRAM, at the expense of increased transfer time. Also note that using ECC on larger blocks, such as 64-byte cache lines, may be attractive in some applications. However, the mapping of ECC codes to unused RAM locations and the ECC-generation/checking protocols are beyond the scope of this standard.

4.3.3 Controller-based parity

SyncLink also allows the controller to implement simple byte-parity error-detection circuitry (EDC), using the same data-transfer protocols previously discussed. However, (when compared to ECC) the error-detection protocols are less robust; double-bit errors are not detected and single-bit errors cannot be corrected.

Furthermore, parity has the same overheads and protocols, so only saves gates in the controller compared to ECC, so is less attractive than in some earlier systems.

4.4 Error-checking

SLDRAMs that detect errors are expected to set a fatal-error bit in a special register that can be read by the controller when it wishes to check whether errors have been detected.

IEEE
P1596.7-199X

49

Draft 0.99 October 14, 1996
DRAFT Standard for A High-Speed

Copyright © 1996 IEEE
This is an unapproved IEEE Standards Draft, subject to change.

5. SyncLink operation

5.1 SyncLink addressing

Various applications find it desirable to use SLDRAMs in a variety of configurations, as illustrated in figure 13.

Data transfers in some of these configurations require selecting one SLDRAM chip at a time, as in the top example in the figure. Others, such as SIMMs or onboard arrays, require selecting specific parallel subsets of the SLDRAM chips at the same time. The traditional RAM chip has addressed this problem by providing an enable signal to each RAM chip, but driving the enable signals correctly in a high speed memory system can be difficult. SyncLink uses an encoded chip select sent over the command link to avoid these difficulties.

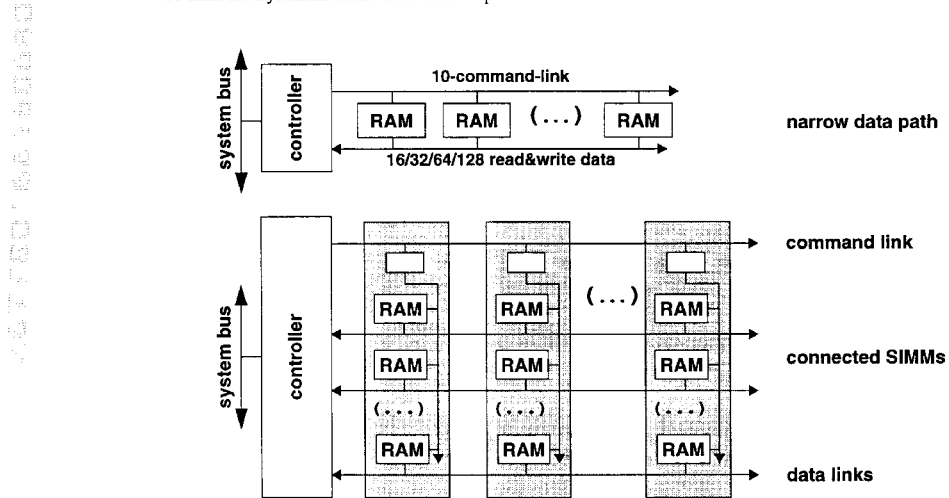

Figure 13—Various SLDRAM configurations

5.1.1 Chip select techniques

To support variable-width connections and a wide variety of configurations, the following address-compare logic, as illustrated in figure 14, is used. The compare logic supports a variety of multicast (x2, x4, ...) addresses in addition to single-chip and broadcast addresses.

Decoding of multicast slaveId addresses is simpler and more flexible than providing separate *chipSelect* signals to individual DRAMs, as is done with currently-available synchronous-DRAMs. Controlling the skew between chip-select signals (which are radially distributed) and command signals (which are bussed) isn't practical at high DRAM clock rates. Although the DRAM's address comparison logic is more complex, that is a tiny fraction of the interface logic and is more than compensated by the resulting simplification in PC-board and command-buffer designs.

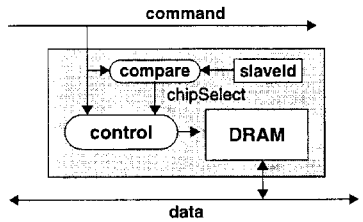

Figure 14—chipSelect signal usage

5.1.2 slaveId comparison logic

To encode the power-of-two multicast addresses, the number of DRAM chips is limited to 64. The lower 0-through-63 locations are used to address individual chips; the higher 64-through-127 locations specify multicast addresses.

Every other one of the 64 multicast addresses specifies a ×2 multicast address. Thus, slaveId values of {0,1} are accessed using multicast address 64, slaveId values of {2,3} are accessed using multicast address 66, slaveId values of {4,5} are accessed using multicast address 68, etc.

Of the remaining 32 multicast addresses, every other one specifies a ×4 multicast address. Thus, slaveId values of {0,1,2,3} are accessed using multicast address 65, slaveId values of {4,5,6,7} are accessed using multicast address 69, slaveId values of {8,9,10,11} are accessed using multicast address 73, etc.

Of the remaining 16 multicast addresses, every other one specifies a ×8 multicast address. Thus, slaveId values of {0,1,...,6,7} are accessed using multicast address 67, slaveId values of {8,9,...,14,15} are accessed using multicast address 75, slaveId values of {16,17,...,22,23} are accessed using multicast address 83, etc.

Of the remaining 8 multicast addresses, every other one specifies a ×16 multicast address. Thus, slaveId values of {0,1,...,14,15} are accessed using multicast address 71, slaveId values of {16,17,...,30,31} are accessed using multicast address 87, slaveId values of {32,33,...,46,47} are accessed using multicast address 103, etc.

There are two addresses that would naturally encode a broadcast, 95 and 127, but only the 95 address is used. The 127 address is used in a sync pattern.

The complete set of multicast-address assignments is listed in Annex B.

5.2 SyncLink address space

The SyncLink address space is partitioned into 64 nodes, each with an arbitrarily large memory space, as illustrated in figure 15. The packet format allows adding address bytes as needed, for indefinite expansion, but with 10-bit-wide control paths and 3 bits of subcommand, the natural address widths are: 27, 37, 47, ... bits. The alignment of these bits is expected to be "left justified," i.e. however many bits the SLDRAM chip requires, starting at the high-order bit of the address field in the second "byte" of the command packet (see formats, section 6). Since the command set does not require byte addressing at the SLDRAM level, the SLDRAM address selects an item of the natural size of the smallest supported SLDRAM data burst: 16 or 18 bits as appropriate (8 or 9 bits if half-width SLDRAMs are made, possibly useful for certain ECC schemes), times the minimum burst length, 4. Thus the minimum burst is inherently aligned on a multiple of its own size.

Longer bursts shall be aligned on a multiple of their own size as well, i.e. bursts of twice the minimum length shall have the least significant SLDRAM address bit be a zero, and bursts of four times the minimum length shall have the two least significant SLDRAM address bits be zero. (This constraint was added for the purpose of simplifying the SLDRAM internal logic.)

The mapping between the SLDRAM addresses and the system-level byte addresses is handled at the SyncLink controller.

SLDRAM chips are expected to have less than 128 control registers, which can be set using the store command. The values of the control registers determine a variety of RAM operational parameters, to be defined. Similarly, up to 128 status registers can be read by the load command, and 128 event actions could be defined.

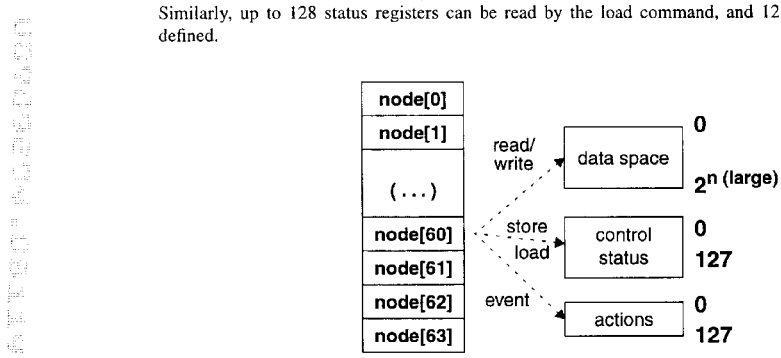

Figure 15—SyncLink address space partitioning

*Load, store, read, write,* and *event* can all be broadcast and multicast.

5.3 Address errors

The SyncLink initialization process allows the controller to determine the number of attached SLDRAMs. Reads of standard ROMs or status registers associated with the SLDRAMs allow the controller to determine SLDRAM capabilities. Thus, the controller is expected to know the addresses of the attached SLDRAMs and their capabilities, so that request packets containing invalid addresses are not expected to be generated. To minimize costs, the results of such invalid requests are undefined.

5.4 SyncLink transactions

To access SLDRAM, the controller initiates *read* or *write* transactions addressed to one or more of the SLDRAMs on the attached links. SyncLink uses split-data transactions because the read data packet is not returned immediately (or the write data are not needed immediately), so other (possibly unrelated) commands may be transmitted on the *commandLink*, or other data may be transmitted on the *dataLink*, while the request is being processed by the SLDRAM. The *read* and *write* transfer bursts of data, so the total data transferred depends on the width of the SLDRAM's data path, the number of SLDRAMs that are accessed concurrently, and the length of the burst.

The timing of data flow on the *dataLink* relative to the corresponding request (command/address) packet on the *commandLink* is set at initialization time. On systems that have a range of attached DRAM speeds, simple controllers are expected to set all SLDRAMs to operate at the speed of the slowest attached SLDRAM.

To set such parameters in the SLDRAMs at initialization time, the controller uses a *store* command to place the appropriate values into the control registers.

Once conservative values for these parameters have been loaded into every SLDRAM, a *load* command, essentially a *read* with special addressing, can be used to read configuration information from each SLDRAM via the *dataLink*. This information can then be used to refine the SLDRAM parameter settings. For example, a broadcast command could set the SLDRAMs to respond very slowly, so that even the slowest device can comply when interrogated by *load* commands. Then the controller determines the actual speed capabilities of the SLDRAMs using *loads* and finally *stores* the corresponding parameter values appropriate for normal high speed operation.

A very compact *event* command is provided for synchronizing refresh and controlling certain operating modes. Seven bits are available in the *event* command that specify its action. *Events* may be broadcast or multicast, and so can all the other transaction types for which this may be useful.

For *reads* or *loads*, the delay between the command and the SLDRAM response with data on the *dataLink* is set by a control register.

For *writes*, the delay between the command and the time when the SLDRAM accepts data from the *dataLink* is set by a control register.

5.4.1 Read transactions

*Reads* are split-response transactions with two components, called request and response packets, as illustrated in figure 16.

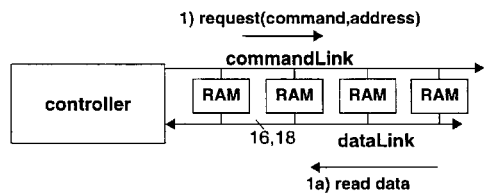

Figure 16—Read transaction

For reading a burst of data, a *read* transaction is used. A *read* request packet transfers command and address from the controller to the SLDRAM. The data packet returns data, after a fixed delay $T_{rc}$, which is set at initialization time. This delay is essentially the sum of the row-access and the column-access delays of the SLDRAM. To ensure interoperability among SLDRAM technologies, this delay value can be set to a (greater than nominal) value by storing the value to be used into a control register in the SLDRAM. A *read* can be directed to one SLDRAM, or multicast. Multicast is only useful when there are multiple *dataLinks*, because only one device at a time is permitted to drive any particular *dataLink*.

5.4.2 Load transactions

A *load* transaction is similar to a *read*, but uses special addressing to access information about the characteristics of particular SLDRAMs, usually information needed for initializing the system. The delay for *load* data is also set by *Trc*, on the assumption that registers can be accessed at least as fast as SLDRAM. A *load* can be directed to one SLDRAM, or multicast. Multicast is only useful when there are multiple *dataLinks*, because only one device at a time is permitted to drive any particular *dataLink*.

5.4.3 Write transactions

The *write* request packet transfers command and address from the controller to the SLDRAM on the *commandLink*, and after a precise delay the controller transfers data to the SLDRAM on the *dataLink*, as illustrated in figure 17. No response packet is returned. A *write* can be directed to one SLDRAM, multicast to a subset, or broadcast to all.

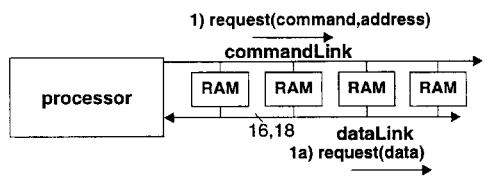

Figure 17—Write transaction

The SLDRAM accepts the controller-provided data from the *dataLink* after a delay $T_{wc}$, which is set at initialization time. This delay is essentially the sum of the row-access and the column-access delays of the SLDRAM. To improve scheduling efficiency, it is expected that write data will be delayed to occupy the same time slot on the *dataLink* that data from a similarly addressed *read* would have used.

If a previous operation has left a row holding data into which this *write*'s data are to be merged, *i.e.*, the correct row is *open*, the timing of the transfers is unchanged but less power may be consumed by the SLDRAM.

5.4.4 Event transactions

An *event* transaction is similar to a *write*, but an abbreviated address is used, and the *dataLink* is not used. An *event* can be directed to one SLDRAM, multicast to a subset, or broadcast to all. *Events* transfer only seven bits (encoded) of control information from the controller to the SLDRAM(s). Because of their limited information content, *events* are only used for special control purposes (such as synchronizing SLDRAM refresh operations).

5.4.5 Store transactions

A *store* transaction is similar to an *event*, but contains data that are sent on the *commandLink* for storage into control registers within the SLDRAMs. A *store* can be directed to one SLDRAM, multicast to a subset, or broadcast to all. *Store* is used during initialization to set the operating parameters needed by the SLDRAMs to values compatible with the requirements of the controller and other SLDRAMs in the system.

5.4.6 Response scheduling

The controller is responsible for timing the generation of its request packets and scheduling the transfer of read and write data, to ensure that the various commands and data transfers do not collide.

The controller shall ensure the following requirements have been met:

a)  The *commandLink* carries only one packet at a time.
b)  Any *dataLink* is driven by only one device, whether controller or SLDRAM, at a time.
c)  The time delay *Trc* assigned for use in the *read* transactions is sufficient to meet the row-access plus column-access time requirements of the SLDRAMs involved.
d)  The time delay *Twc* assigned for use in the *write* transactions is sufficient to meet the row-access plus column-access time requirements of the SLDRAMs involved.
e)  The controller does not send another access to the same row until the recovery time following a row's closing has elapsed.
f)  The controller does not read from a row that has been written until any needed recovery time has elapsed (e.g., if internal data paths are shared by read data and write data).

In addition it is expected that:

g)  All *reads* use the same timing, and all *writes* use the same timing, to support pipelined operation.
h)  Leaving a row open during a *read*/modify/*write* sequence may be used to reduce power.

Within hardwired configurations, the controller is expected to be preprogrammed with knowledge of the attached devices, particularly memory (which may be fixed in the number of supported devices). In field-configurable applications, the SLDRAM devices may provide ROM to identify their capabilities.

Although the potential number of outstanding transactions (those for which a request has been sent, but a response hasn't been returned) is large, the controller complexity is typically reduced by restricting the number of allowed outstanding transactions to a much smaller number (typically 4).

5.5 Refresh operations

RAMs based on dynamic memory technologies have to be "refreshed." To avoid data corruption, refresh operations are typically performed periodically, which bounds the maximum time between successive refresh operations on any storage locations. Refresh is expected to be explicitly scheduled by the controller.

The controller defers other queued dependent requests while a refresh operation is being performed.

SyncLink simplifies the SLDRAMs by placing the refresh responsibility in the controller (except during shutDown operation).

5.5.1 Autorefresh

To support efficient controller scheduling algorithms, refresh-dependent SLDRAMs shall support autorefresh. The prefix *auto* refers to the addressing, which is automatically updated by the SLDRAM, not the timing, which is explicitly set by the controller.

By using the autorefresh capability, the controller can accurately predict SLDRAM response times and can schedule refresh activity during idle periods. Accurately specified response times simplify diagnosis of system failures, since memory-access sequences are repeatable. Accurately specified response times also help synchronize RAID-like memory arrays or array-element processing in vector-processing applications.

Broadcast and directed *refresh* events initiate the SLDRAM's refresh operations.

The refresh requirements of various RAMs differ significantly. To simplify controllers and ensure interoperability between memory chips, the refresh requirements of SLDRAMs are constrained. SLDRAMs in autorefresh mode shall be designed to operate correctly if the controller issues the *refreshNow* events as appropriate for the SLDRAM that needs the most frequent refresh. Other SLDRAMs should count and ignore the appropriate fraction of these events, based on the refresh-rate parameter as set at initialization time.

5.5.2 Selfrefresh

Selfrefresh, in which SLDRAMs autonomously refresh themselves, is done by all SLDRAMs during low-power shutDown operation of the system.

5.5.3 Unsupported refresh modes

Addressed refresh, where the controller provides explicit addresses to refresh specific rows when it chooses, is not supported by this standard.

IEEE
P1596.7-199X

Draft 0.99 October 14, 1996
DRAFT Standard for A High-Speed

Copyright ©1996 IEEE
This is an unapproved IEEE Standards Draft, subject to change.

Draft 0.99 October 14, 1996
Memory Interface (SyncLink)

IEEE
P1596.7-199X

6. Packet formats

6.1 Packet components

SyncLink communication is initiated by the controller, which sends *read*, *write*, *event*, *load*, and *store* command/address packets to the attached SLDRAMs. Space between command packets is filled with *idle* cycles.

6.1.1 Command/address packet framing

All command/address packets start with a 0-to-1 flag-value transition. The flag maintains its 1 value for one tick, then the flag is returned to 0 (and remains 0 until the next packet). These packet-formatting conventions are illustrated in figure 18.

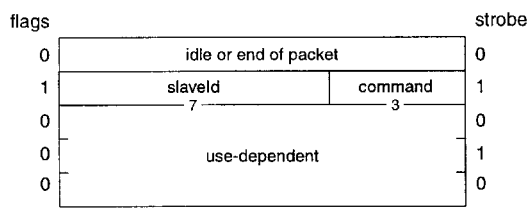

Figure 18—Command/address packet framing

6.1.2 Controller-generated idle bytes

The controller generates idle bytes on the *commandLink* when there are no additional request packets to be sent. The idle is uniquely identified by the 0 flag values that are not the final bytes within any command packet, as illustrated in figure 19. The data bits are 0's, with other values reserved for possible future use. If

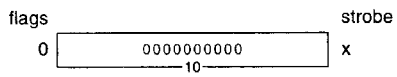

Figure 19—Idle bytes format another *commandLink* signal, *listen*, not shown here, is deasserted, the flag and data lines c0–c9 may be undriven while the strobe continues. If another system signal, *linkOn*, a low-speed signal not shown here, is deasserted, the flag, data, and strobe may all be undriven.

6.2 DataLink packets

A packet is generated on the *dataLink* by an SLDRAM when completing a *read* or *load* transaction, or by the controller when completing a *write* transaction.

The *dataLink* is scheduled by the controller so that data are placed on it by the controller or by the memory, and read by the memory or the controller respectively, at the appointed time. Thus the data packet contains only data and needs no address or other header information. At times when no data are scheduled, the signal lines on the *dataLink* are undriven. The format of the data packet is shown in figure 20.

Copyright ©1996 IEEE
This is an unapproved IEEE Standards Draft, subject to change.

IEEE  
P1596.7-199X

Draft 0.99 October 14, 1996  
DRAFT Standard for A High-Speed

The 1-bit fields labeled "d" are optional, corresponding to the use of 18-bit-wide memories instead of 16-bit-wide memories, one way of providing the extra data needed for Error Correcting Codes.

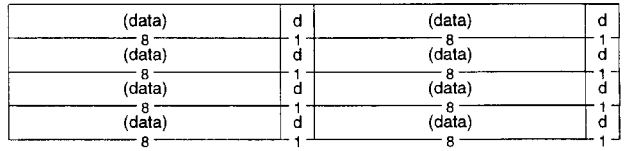

Figure 20—Data packet format

6.3 Command/address packet formats

A command/address packet is generated by the controller and consumed by an SLDRAM. A basic request contains an initial *slaveId* and the command bits, then subcommand bits and the most significant part of the address, then the remainder of the address, as illustrated in figure 21. For certain commands, register-index values and data are placed in the address-field locations.

The 7-bit *slaveId* field specifies which SLDRAM(s) is/are to be selected.

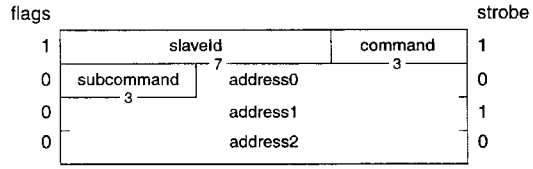

Figure 21—Command/address packet components

The larger *slaveId* values (>63) are special. They uniquely label broadcast, multicast, and directed packets, as summarized in table 1.

Table 1—SlaveId values (first field)

| slaveId | Description |
|---|---|
| 0-63 | Dynamically allocated identifiers |
| 63 | Initial identifier assignment |
| 64-126 | multicast read or write (see table 6) |
| 127 | sync-pattern address |

6.3.1 Command values

The *command* and *subcommand* bits in the second and third fields of a command/address packet identify the packet's format and general function, as shown in table 2. The *read* and *write* operations all specify whether to take advantage of faster timing because of accessing an already-open row, and whether to leave the row open or not.

There are three burst sizes: 4, 8, and 16 bits per *dataLink* signal. The longer bursts may permit saving power by not driving the command/address bus unnecessarily, and are convenient sizes for common cache-line bursts and common configurations.

Each operation that uses the *dataLink* also specifies whether to use the *even* (*dataE*) or the *odd* (*dataO*) *dataLink* clock signal for timing.

Table 2—Command and Subcommand Encoding

| command | FromRow | Size | subcommand | R/W | LeaveRow | dataO/dataE | name |
|---|---|---|---|---|---|---|---|
| 000 | Open | 4 | 000 | Read | Open | Even | Read4OO0 |
| 000 | Open | 4 | 001 | Read | Open | Odd | Read4OO1 |
| 000 | Open | 4 | 010 | Read | Closed | Even | Read4OC0 |
| 000 | Open | 4 | 011 | Read | Closed | Odd | Read4OC1 |
| 000 | Open | 4 | 100 | Write | Open | Even | Write4OO0 |
| 000 | Open | 4 | 101 | Write | Open | Odd | Write4OO1 |
| 000 | Open | 4 | 110 | Write | Closed | Even | Write4OC0 |
| 000 | Open | 4 | 111 | Write | Closed | Odd | Write4OC1 |
| 001 | Open | 8 | 000 | Read | Open | Even | Read8OO0 |
| 001 | Open | 8 | 001 | Read | Open | Odd | Read8OO1 |
| 001 | Open | 8 | 010 | Read | Closed | Even | Read8OC0 |
| 001 | Open | 8 | 011 | Read | Closed | Odd | Read8OC1 |
| 001 | Open | 8 | 100 | Write | Open | Even | Write8OO0 |
| 001 | Open | 8 | 101 | Write | Open | Odd | Write8OO1 |
| 001 | Open | 8 | 110 | Write | Closed | Even | Write8OC0 |
| 001 | Open | 8 | 111 | Write | Closed | Odd | Write8OC1 |
| 010 | Open | 16 | 000 | Read | Open | Even | Read16OO0 |
| 010 | Open | 16 | 001 | Read | Open | Odd | Read16OO1 |
| 010 | Open | 16 | 010 | Read | Closed | Even | Read16OC0 |
| 010 | Open | 16 | 011 | Read | Closed | Odd | Read16OC1 |
| 010 | Open | 16 | 100 | Write | Open | Even | Write16OO0 |
| 010 | Open | 16 | 101 | Write | Open | Odd | Write16OO1 |
| 010 | Open | 16 | 110 | Write | Closed | Even | Write16OC0 |
| 010 | Open | 16 | 111 | Write | Closed | Odd | Write16OC1 |
| 011 | | | 000 | (R) | | Even | Load |
| 011 | | | 001 | (R) | | Odd | Load |
| 011 | | | 010 | (R) | | | reserved |
| 011 | | | 011 | (R) | Closed | | CloseRow |
| 011 | | | 100 | (W) | | Even | writeSync |
| 011 | | | 101 | (W) | | Odd | writeSync |
| 011 | | | 110 | (W) | | | Store |
| 011 | | | 111 | (W) | | | Event |
| 100 | Closed | 4 | 000 | Read | Open | Even | Read4CO0 |
| 100 | Closed | 4 | 001 | Read | Open | Odd | Read4CO1 |
| 100 | Closed | 4 | 010 | Read | Closed | Even | Read4CC0 |
| 100 | Closed | 4 | 011 | Read | Closed | Odd | Read4CC1 |
| 100 | Closed | 4 | 100 | Write | Open | Even | Write4CO0 |
| 100 | Closed | 4 | 101 | Write | Open | Odd | Write4CO1 |
| 100 | Closed | 4 | 110 | Write | Closed | Even | Write4CC0 |
| 100 | Closed | 4 | 111 | Write | Closed | Odd | Write4CC1 |
| 101 | Closed | 8 | 000 | Read | Open | Even | Read8CO0 |
| 101 | Closed | 8 | 001 | Read | Open | Odd | Read8CO1 |
| 101 | Closed | 8 | 010 | Read | Closed | Even | Read8CC0 |
| 101 | Closed | 8 | 011 | Read | Closed | Odd | Read8CC1 |
| 101 | Closed | 8 | 100 | Write | Open | Even | Write8CO0 |
| 101 | Closed | 8 | 101 | Write | Open | Odd | Write8CO1 |
| 101 | Closed | 8 | 110 | Write | Closed | Even | Write8CC0 |
| 101 | Closed | 8 | 111 | Write | Closed | Odd | Write8CC1 |
| 110 | Closed | 16 | 000 | Read | Open | Even | Read16CO0 |
| 110 | Closed | 16 | 001 | Read | Open | Odd | Read16CO1 |
| 110 | Closed | 16 | 010 | Read | Closed | Even | Read16CC0 |
| 110 | Closed | 16 | 011 | Read | Closed | Odd | Read16CC1 |
| 110 | Closed | 16 | 100 | Write | Open | Even | Write16CO0 |
| 110 | Closed | 16 | 101 | Write | Open | Odd | Write16CO1 |
| 110 | Closed | 16 | 110 | Write | Closed | Even | Write16CC0 |
| 110 | Closed | 16 | 111 | Write | Closed | Odd | Write16CC1 |
| 111 | | | xxx | | | | Sync (NoOp) |

Draft 0.99 October 14, 1996
Memory Interface (SyncLink)

IEEE
P1596.7-199X

6.4 Sync packet

For the *sync* packet, the *slaveId* is 1111111, the *command* is 111, the *subcommand* is 111, the first 7 bits of the address field are 1111111 and the remainder of the packet contains 0's as illustrated in figure 22. The purpose of this packet is to provide a wave of 1's and 0's while the SLDRAMs are adjusting the timing of their command-sampling circuitry during startup. The SLDRAMs detect the occurrence of a *sync* packet by the flag's being 1 for two consecutive ticks, which never happens except during a *sync* packet. This allows a *sync* packet to be recognized reliably even in the earliest stages of initialization, without relying on correctly detecting or decoding any of the command or address bits. Thus a series of *sync* packets enables an SLDRAM to adjust its *commandLink* bit-sampling circuitry until the observed bits match the standard *sync* pattern.

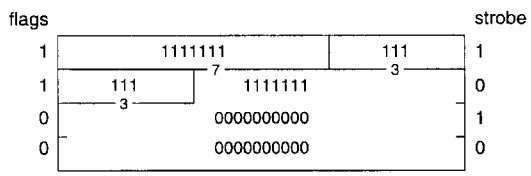

Figure 22—Sync packet format

6.5 Read request packet

For a *read* request, the packet format is shown in figure 23, with the *command* and *subcommand* values given in table 2.

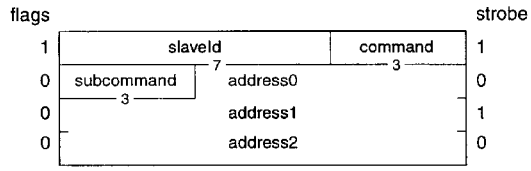

Figure 23—Read request packet format

6.6 Load packet

For the *load* packet, the packet format is shown in figure 24, with the *command* and *subcommand* values given in table 2.

The *index* specifies an internal control register within the addressed device, whose data are to be read out on the *dataLink*, just as for any *read* transaction. This is normally used at initialization time to discover the particular timing and other characteristics of this device that must be known by the controller in order to operate the system correctly.

Copyright ©1996 IEEE
This is an unapproved IEEE Standards Draft, subject to change.

IEEE  
P1596.7-199X

Draft 0.99 October 14, 1996  
DRAFT Standard for A High-Speed

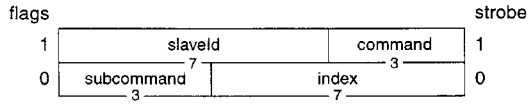

Figure 24—Load packet format

6.7 Write request packet

For a *write* request, the packet format is shown in figure 25, with the *command* and *subcommand* values given in table 2.

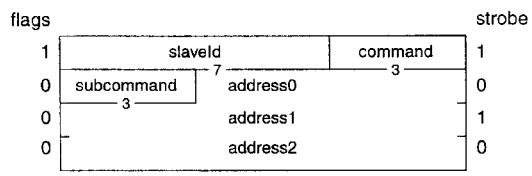

Figure 25—Write request packet format

6.8 WriteSync packet

For the *WriteSync* packet, the packet format is shown in figure 26, with the *command* and *subcommand* values given in table 2. The purpose of this packet is to prepare the SLDRAM to receive a wave of 1's and 0's on the *dataLink* while the controller is adjusting the timing of the SLDRAM's write-data-sampling circuitry, delayA, during startup. This differs from a normal *write* in that the SLDRAM stores the received data in a status register rather than in the RAM array, where it would corrupt user data when used as part of a maintenance or tuning operation during normal operation.

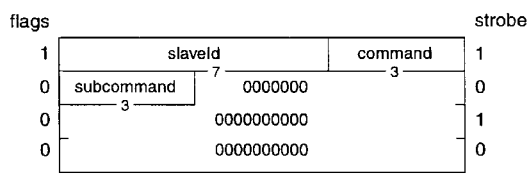

Figure 26—WriteSync packet format

6.9 Store packet

For the *store* packet, the packet format is shown in figure 27, with the *command* and *subcommand* values given in table 2.

The *index* specifies an internal control register within the addressed device, which is loaded with the data provided. This is normally used at initialization time to load the particular timing and other parameters that may be needed for correct operation.

Copyright ©1996 IEEE  
This is an unapproved IEEE Standards Draft, subject to change.

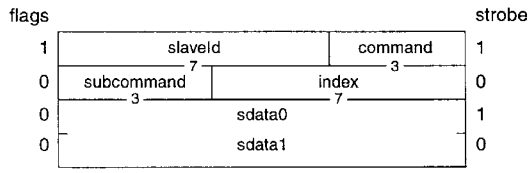

Figure 27—Store packet format

6.10 Event packet

For the *event* packet, the packet format is shown in figure 28. Events can be viewed as specialized store transactions, for which no data are required. Events are used to send signals or control information from the controller to the SLDRAMs. Events are specified by their 7-bit index value, as specified in 6.10.1.

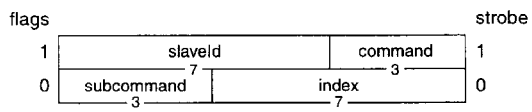

Figure 28—Event command

6.10.1 Event index codes

There are 128 possible event codes, as specified in table 3. Several standard code values are defined, and there is also provision for vendor-dependent code values.

Table 3—Event index codes

| index | command | description |
|---|---|---|
| 0 | resetHard | take slaveId 63, initialize to reset state |
| 1 | resetSoft | initialize to reset state |
| 2 | refresh | autorefresh signal |
| 3 | closeRows | close all open rows |
| 4 | increaseA | increase the input sample delay one step (see 8.2) |
| 5 | decreaseA | decrease the input sample delay one step (see 8.2) |
| 6 | increaseB | increase the output signal delay one step (see 8.2) |
| 7 | decreaseB | decrease the output signal delay one step (see 8.2) |
| 8 | observeFlag | trigger staggered sampling latches in next command |
| 9 | enable18 | enable the a8 and b8 receivers and drivers in 18-bit SLDRAM |
| 10 | disable18 | disable the a8 and b8 receivers and drivers in 18-bit SLDRAM |
| 11–63 | — | reserved |
| 64–127 | dependent | vendor dependent |

A *resetHard* event forces the device to assume *slaveId* 63 and sets the SLDRAM to its initial state. The *resetHard* event is equivalent to the *reset* signal; see 7.1.1 for details.

A *closeRow* event closes all open rows of all banks of the device.

A *resetSoft* code initializes the SLDRAM to its initial state, with the exception that its assigned slaveId value remains unchanged. A *resetSoft* would typically be used for diagnostic purposes.

*refresh* events are expected to be broadcast to all, but could be directed to SLDRAMs with distinct refresh-timing requirements.

SLDRAMs that implement the 18-bit dataLink reset to a state where the two extra bits are disabled, for compability in mixed systems. The *enable18* event enables those bits.

The *dependent* events are expected to be directed to one SLDRAM, rather than broadcast to all. The definition of these vendor-specific codes is beyond the scope of this standard.

6.10.2 Event processing time

There is no easy way to determine when the event-specified effects have occurred. To simplify controller scheduling, $t_{event}$, the time delay between the receipt of the event packet's final byte and the completion of the event-packet processing, shall be specified by the SLDRAM vendor. Except when explicitly stated otherwise, the event processing may occur at any time up to $t_{event}$. If one or more additional events are received before the first event has been processed, all but the first event may be ignored; it is the controller's responsibility to ensure that this does not occur.

6.11 CloseRow

For the *closeRow* packet, the format is shown in figure 29. The packet contains address bits in the same format used for read or write. The CloseRow packet commands the addressed SLDRAMs to close the row corresponding to the given address.

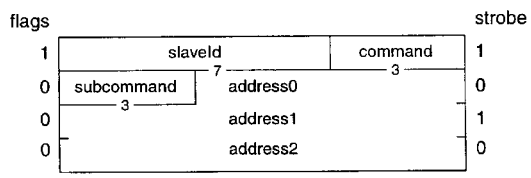

Figure 29—CloseRow packet format

7. SyncLink initialization and control

7.1 ShutOff (or powerUp) recovery

7.1.1 SyncLink reset

After *shutOff* recovery, the controller resets its attached SLDRAMs and then assigns them their (nonconflicting) slaveId values. The attached SLDRAMs are reset by asserting the *reset* signal. The *reset* signal (or a *resetHard* event) initializes the SLDRAM state and sets the slaveId values to their initial value of 63, as illustrated in figure 30.

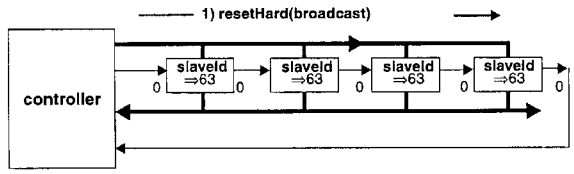

Figure 30—Effect of resetHard

After reset, SLDRAMs shall drive *selectOut* to the 0 value until they detect a *store* packet that sets their slaveId (even if it sets their slaveId to 63 again). The *resetHard* is an *event*; no response packet is returned.

7.1.2 CommandLink synchronization

After reset, the controller drives the *commandLink* strobe and sends 128 consecutive *sync* packets to allow the SLDRAMs to align their receivers to the *commandLink* signals. This ensures that *store* packets can be received reliably.

7.1.3 Establishing addressibility: SlaveId assignments

The *selectIn/selectOut* signals ensure that only the closest unconfigured SLDRAM is affected by each of the *configHard* events.

After the *resetHard* event sets slaveIds to 63, the controller sends *store* packets (addressed to the slaveId 63 address) to update the slaveIds to their final distinct values. The 63-slaveId-valued SLDRAMs ignore the *store* packet while their *selectIn* signal is 1, so only the first of the unconfigured SLDRAMs processes the packet and changes its address and its *selectOut* signal, as illustrated in figure 31.

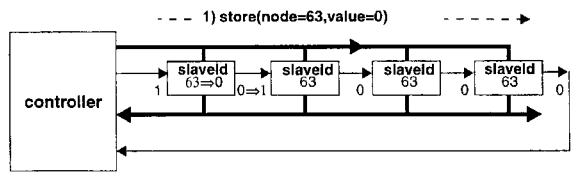

Figure 31—Initial slaveId assignments

After the first *store*, the second SLDRAM's *selectIn* value is 1, so it will be affected by the next *store*. Thus, the first through last *stores* affect the first through last SLDRAMs, where the SLDRAM ordering is determined by their distance from the controller.

Because a reset occurs between shutDown recovery and the initial slaveId assignments, the *selectIn/selectOut* signals can be unambiguously used to provide shutDown-completion status and uniqueness for the slaveId-configuration process.

The remaining slaveId values are assigned by sending additional *stores* to set the slaveId values in the next, through final, SLDRAMs. The address reassignment process stops when the final SLDRAM's *selectOut* signal becomes 1. The next-to-last and last steps in this slaveId-assignment process are illustrated in figure 32.

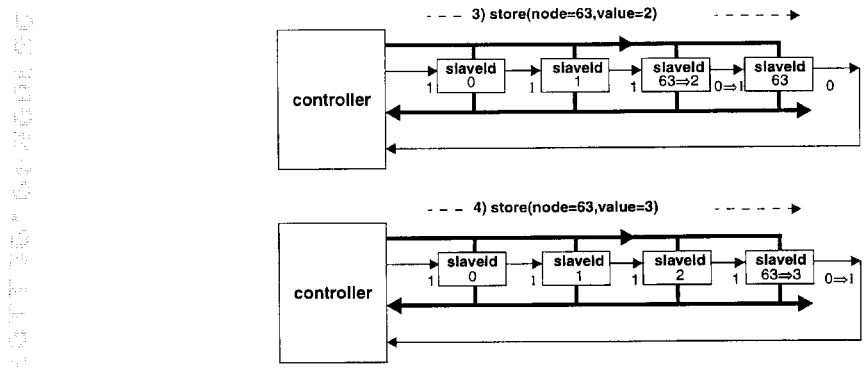

Figure 32—Final slaveId assignments

Controllers are expected to set the slaveId values in an increasing order, starting from zero. However, when advancing from one multi-SLDRAM module to the next, the slaveId should be advanced to the next appropriate power of 2, so that multicast addressing can conveniently select all the SLDRAMs in one module with a single command.

The controller is expected to map its received system addresses to the correct (often multicast) slaveIds and offsets.

The *selectIn/selectOut* daisy chain shall pass through all the SLDRAMs attached to the controller, which implies that multi-SLDRAM modules shall include their internal SLDRAMs on an internal daisy chain that joins the system daisy chain at the module connector. Systems with SLDRAM module sockets that might be partially populated should include a 1 kΩ resistor that bridges the daisy chain pins at each socket, so that empty sockets do not break the path back to the controller. (This is a slow signal, sensed by a high input impedance receiver at the controller or the next SLDRAM, so 1 kΩ is low enough to pass the signal yet high enough to cause no power dissipation problems during the brief periods that the signal on the two pins differs when a module is present.) This is illustrated in figure 33.

Draft 0.99 October 14, 1996
Memory Interface (SyncLink)

IEEE
P1596.7-199X

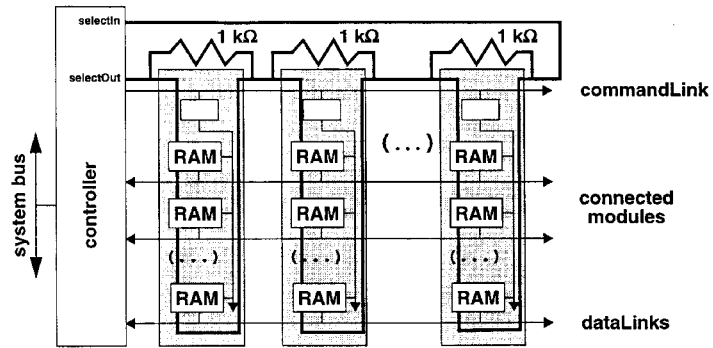

Figure 33—selectIn/selectOut daisy chain through modules

7.1.4 Establishing *read* communication on the dataLink

At this stage, the *store* command is known to work and the SLDRAM addresses have been set, but no data has been transferred over the *dataLink*.

The next step is to set up each of the SLDRAMs' delayB vernier timers so that they output their data from a *load* with the correct timing. This is done by sending each specific SLDRAM a directed *load* command that causes the SLDRAM to emit a dataSync pattern on the dataLink (all 1-bits for one tick, then all 0-bits for three ticks). The controller may repeat this event as necessary, observing the data transitions (from 1 to 0), and storing corrected values in the delayB control register with a *store* command, until all the SLDRAMs emit their *load* data at the time the Controller wishes to see it. (Larger corrections than 1 tick may be needed, in which case the controller compensates by adding integer ticks to the response timer control registers as necessary to keep the vernier delays within their operating range.)

When this step is complete, the controller can send the *load* command to any SLDRAM and will receive the test pattern at the same time, accurate to a small fraction of a tick. This timing is identical to that used for *read* commands, so at this point *read* commands should be working correctly, though the contents of the RAM is undefined (unless this adjustment was done for maintenance or monitoring during normal operation, in which case the contents of the RAM have remained undisturbed).

7.1.5 Establishing *write* communication on the dataLink

The final step is to set up each of the SLDRAMs' delayA vernier timers so that they sample their input *write* data with the correct timing. This is done by sending a dataSync pattern from the controller to the SLDRAM with a special *writeSync* command that stores the received data in registers, not in the actual RAM array (in order to protect user data when this procedure is used for maintenance or monitoring during normal operation).

The data strobed by the SLDRAM is then read back by the controller (using the *load* command, which was aligned in the previous step), and compared with the desired results.

The controller then stores new values in the delayA vernier timer control register and repeats the experiment, varying the vernier delayA timing in order to find the range of values that cause the data to be strobed correctly. The controller then sets the delayA timing in the middle of this range to optimize for safe operation.

Copyright ©1996 IEEE
This is an unapproved IEEE Standards Draft, subject to change.

At this point, both *read* and *write* work correctly, and the system is ready to begin normal operation.

7.2 Self test and initialize

This specification provides mechanisms for initializing and (to a limited extent) testing the communication paths between the controller and attached SLDRAMs. In some cases, SLDRAMs are expected to provide additional diagnostic capabilities, to perform more-extensive self-test or state-initialization operations. For example, memory chips could self-initialize to fixed and/or programmable data patterns.

SyncLink does not provide specific mechanisms for invoking self-test or state-initialization operations, or for returning completion-status results.

7.3 Control registers

There are potentially 128 20-bit control registers that can be set by the STORE command, as shown in table 4.

Table 4—Control registers

| register | Description |
|---|---|
| 0 | slaveID |
| 1 | $T_{wc}$: ticks from end of request to start of write data transfer when *command* bit *FromRow* is 1, i.e. the command assumes the row was initially closed |
| 2 | $T_{va}$: vernier delay A setting, with the lsb in the least significant bit of the fourth "byte" of the packet |
| 3 | $T_{wo}$: ticks from end of request to start of write data transfer when *command* bit *FromRow* is 0, i.e. the command assumes the row was initially open |
| 4 | $T_{rc}$: ticks from end of request to start of read data transfer when *command* bit *FromRow* is 1, i.e. the command assumes the row was initially closed |
| 5 | $T_{vb}$: vernier delay B setting, with the lsb in the least significant bit of the fourth "byte" of the packet |
| 6 | $T_{ro}$: ticks from end of request to start of read data transfer when *command* bit *FromRow* is 0, i.e. the command assumes the row was initially open |
| 7–127 | reserved |

7.4 Status registers

There are potentially 128 64-or-72-bit status registers that can be read by the LOAD command as shown in table 5. These include information about the device speed and architecture, manufacturer, type, synchronizing patterns, etc. Most of these will be much shorter than the maximum length; the maximum is a consequence of all transfers on the dataLink being exactly 4 ticks long and the dataLink being 16 or 18 bits wide.

Table 5—Status registers

| register | Description |
|---|---|
| 0 | SLDRAM Manufacturer (optional) |
| 1 | SLDRAM model (optional) |
| 2 | SLDRAM Size (optional) |
| 3 | SLDRAM Speed grade (optional) |
| 4 | dataSync: permanent ROM pattern for aligning *load*<br>11111111-1-11111111-1<br>11111111-1-11111111-1<br>00000000-0-00000000-0<br>00000000-0-00000000-0 |
| 5 | most recent flag-bit trailing edge as observed by stagger-clocked latches in the next command packet after an *observeFlag* event, might look like:<br>0000011111110000<br>Used to rapidly monitor timing drifts to a fractional tick. |
| 6 | data received from last writeSync<br>(when control registers 1 and 2 are set right this should be<br>11111111-1-11111111-1<br>11111111-1-11111111-1<br>00000000-0-00000000-0<br>00000000-0-00000000-0 for an 18-bit SLDRAM) |
| 7 | nonzero means a fatal data error was detected |
| 8-15 | reserved |
| 16 | most recent data-bit-a0 edges as observed by stagger-clocked latches in the data transfer of a writeSync, might look like: 0000011111110000<br>Used to rapidly monitor timing drifts to a fractional tick. |
| 17 | most recent data-bit-a1 edges (optional) |
| 18 | most recent data-bit-a2 edges (optional) |
| 19 | most recent data-bit-a3 edges (optional) |
| 20 | most recent data-bit-a4 edges (optional) |
| 21 | most recent data-bit-a5 edges (optional) |
| 22 | most recent data-bit-a6 edges (optional) |
| 23 | most recent data-bit-a7 edges (optional) |
| 24 | most recent data-bit-a8 edges (optional) |
| 25 | most recent data-bit-a9 edges (optional) |
| 26-31 | reserved |
| 32 | most recent data-bit-b0 edges (optional) |
| 33 | most recent data-bit-a1 edges (optional) |
| 34 | most recent data-bit-a2 edges (optional) |
| 35 | most recent data-bit-a3 edges (optional) |
| 36 | most recent data-bit-a4 edges (optional) |
| 37 | most recent data-bit-a5 edges (optional) |
| 38 | most recent data-bit-a6 edges (optional) |
| 39 | most recent data-bit-a7 edges (optional) |
| 40 | most recent data-bit-a8 edges (optional) |
| 41 | most recent data-bit-a9 edges (optional) |
| 42-127 | reserved |

Copyright ©1996 IEEE
This is an unapproved IEEE Standards Draft, subject to change.

IEEE
P1596.7-199X

Draft 0.99  October 14, 1996
DRAFT Standard for A High-Speed

Copyright ©1996 IEEE
This is an unapproved IEEE Standards Draft, subject to change.

Draft 0.99 October 14, 1996  
Memory Interface (SyncLink)

IEEE  
P1596.7-199X

8. SyncLink signals

Systems that have a tightly configured environment with short traces and excellent shielding can use bused links rather than the more robust point-to-point RingLink signals defined in the RamLink standard. SyncLink has fewer signals and a smaller communication latency than RingLink. The signals describing the SyncLink interface are shown in figure 34. The significance of the dataLink bytes may be arbitrarily chosen for *read/write* accesses to the SLDRAM, but is defined as shown here for *load* accesses.

The illustrated signals are bused low-swing JEDEC SSTL-3 signals, with the exception of the *selectIn/ selectOut*, and *linkOn* signals. The power and ground pins are not shown.

The incoming *strobe* signal delimits data bits on the *commandLink* with each transition, and is also used as a reference clock for the *dataLink*. The *dataLink* outputs are driven and *dataLink* inputs sensed at the same data rate as the *commandLink*, but at controllable offsets from the incoming *strobe* signal. *DataLink* transfers may use the bidirectional *dataE* or *dataO* clocks for precise sampling of *read* and *write* data.

The *selectIn/selectOut* signals have several uses. Immediately after *shutDown*, they indicate when SLDRAMs have synchronized to the incoming signals. During configuration (after a *reset* event has been broadcast), they select the next SLDRAM that responds to the *store* that sets its *slaveId*.

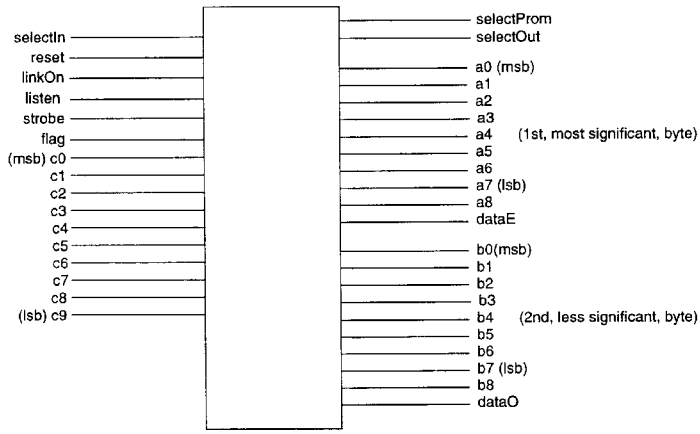

Figure 34—SyncLink interconnect signals

8.1 SyncLink connectivity

SyncLink chips are connected by command and data links. The controller drives the *commandLink* to send *read*, *write*, *load*, *store*, and *event* commands to the SLDRAMs. The *dataLink* is driven by an SLDRAM and received by the controller in the case of *read* and *load* transactions, or driven by the controller and received by an SLDRAM in the case of *write* transactions. Using two links instead of one simplifies the scheduling algorithms and improves bandwidth.

The commandLink is expected to be terminated at the opposite end from the controller. The dataLink is expected to be terminated at both ends. A separate bused *linkOn* signal and point-to-point *selectIn/selectOut* signals are also provided. These signals are illustrated in the simple SyncLink configuration of figure 35.

Copyright ©1996 IEEE  
This is an unapproved IEEE Standards Draft, subject to change.

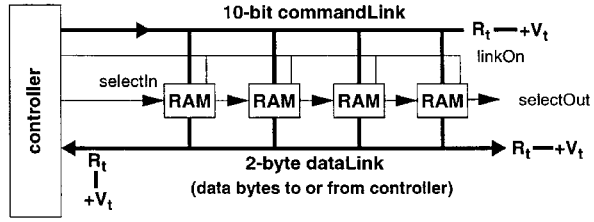

Figure 35—A simple SyncLink topology

8.2 SyncLink signal synchronization

In order to sample the *commandLink* signals reliably, DelayC shall be adjusted by the SLDRAM itself (or be set statically by its design) so that the flag and data are sampled reliably during the stable period between their transitions. This sampling must work properly in order to send commands to the SLDRAMs, so must be stable before initialization of the memory system can begin. The *commandLink* is sent to every SLDRAM, so its route is not generally the same as that of the *dataLink*, and in order to keep its loading approximately the same as that of the *dataLink* it will have to be buffered by amplifiers. These buffers will be used onchip, as shown in figure 36, and in multichip modules, as shown in figure 1. The delay inserted by these buffer amplifiers may be different for each SLDRAM in a system, and it may be comparable to a tick, therefore requiring compensation. All signals of the *commandLink*, including the strobe, shall be routed, loaded, and buffered as identically as possible to minimize timing skew. (More-sophisticated buffers can retime the signals to remove skew if necessary in large systems.)

To maintain synchronous signaling on the *dataLink*, SLDRAM chips have digitally controllable delay circuits (delayA and delayB) that determine precisely when the *dataLink* inputs are sampled and the *dataLink* outputs are driven, as illustrated in figure 36. These delays compensate for clock-buffering delays and differences between the *commandLink* path and the *dataLink* path. The value of delayA is set to ensure that the incoming signals are stable when their values are latched. The value of delayB compensates for delays in the output register, so that transitions in the *dataOut* signals occur at the proper time. When the system powers up, internal feedback in the SLDRAM adjusts delayB to bring the chip outputs into approximate sync with *strobe*, but during operation the internal sync feedback is disabled and the value of delayB is controlled by the controller chip, which sends *store* commands to set the timing directly or *event* commands to increase or decrease the chip output timing in small steps so that the signals are correctly timed at the controller inputs instead of at the SyncLink chip output. The range of this adjustment shall extend at least from −1 to +1 tick over all operating conditions, and the size of the adjustment steps should be approximately one-sixteenth of a tick. Coarser adjustments may be necessary, but those can be handled as integer-tick corrections to the response time registers in the SLDRAM.

Whenever data are transferred on the *dataLink*, the sender shall also drive either *dataE* or *dataO* (whichever was specified by the command that initiated the transfer) with an alternating series 1, 0, 1, 0, etc. These transitions may be used for refining the receiver's strobe timing or for monitoring the delayA/B settings. The controller alternates between *dataE* and *dataO* whenever the sender changes from one SLDRAM to another (successive *reads*) or from Controller to SLDRAM or SLDRAM to Controller (changing between *read* and *write*).

Draft 0.99 October 14, 1996
Memory Interface (SyncLink)

IEEE
P1596.7-199X

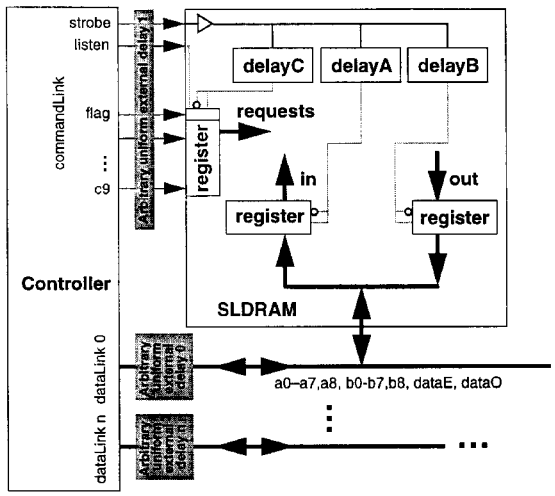

Figure 36—SLDRAM synchronization design model

8.3 Special linkOn considerations

The *linkOn* signal is required to be defined before $V_{cc}$ becomes valid. One way to implement this capability is to connect an enhancement-mode p-channel transistor between *linkOn* and ground, to ensure the *linkOn* signal is driven to ground when power (or a power-dependent active signal) goes low, as illustrated in figure 37.

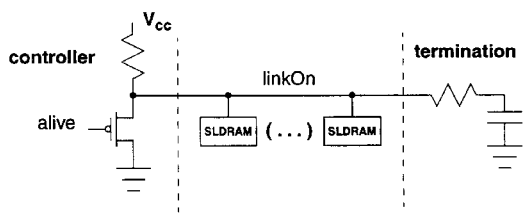

Figure 37—*LinkOn* driver/termination model

8.4 SyncLink reduced-power modes

8.4.1 Standby mode

Moderate power conservation is attained in the standBy mode. Implementations are expected to remain active during standBy operations, but are expected to operate at reduced power.

Copyright ©1996 IEEE
This is an unapproved IEEE Standards Draft, subject to change.

IEEE  
P1596.7-199X  
Draft 0.99 October 14, 1996  
DRAFT Standard for A High-Speed In the standBy mode, only the SyncLink *strobe* and *listen* signals are actively driven and received. Other data receivers and drivers are disabled, thus saving about 80% of I/O power. The definition of "disabled" is physical-layer dependent.

The *listen* signal is synchronous, with the same transition timing as *flag* and *data*. The *listen* signal shall go to 1 before a packet, and may drop to 0 any time after a packet. After the controller asserts *listen*, the flag and data signals remain unasserted (no idles are output). The controller and SLDRAMs may immediately release the other drivers and receivers, leaving the SyncLink output-data lines in an undefined state, as shown in figure 38.

StandBy has no effect on the SLDRAM's operational characteristics. Controllers are expected to reactivate the SLDRAM occasionally to perform autorefresh operations.

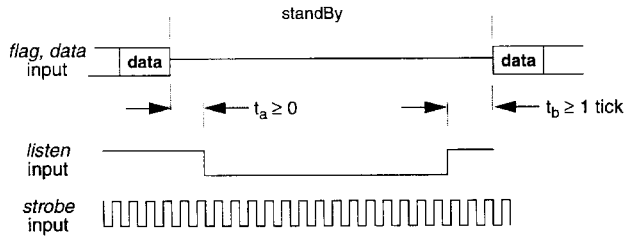

Figure 38—StandBy timing

8.4.2 ShutDown mode

A more severe mode of power conservation is attained in the shutDown mode. It typically takes more time to recover from shutDown mode than to recover from standBy mode, due to the long time constants of the *linkOn* signal and potential phase-locked-loop *strobeIn*-resynchronization delays. Shutdown forces chips to enable their selfrefresh circuitry. Existing slaveId assignments are unchanged.

Once the SLDRAMs are in the standBy mode, the controller drives the *linkOn* signal low to put the SLDRAMs into the shutDown mode. The shutDown mode is entered from the standBy mode, so a delay of $t_{sbOff}$ is required between the receipt of the *listen* deasserted transition and the high assertion of the *linkOn* signal, as illustrated in figure 39.

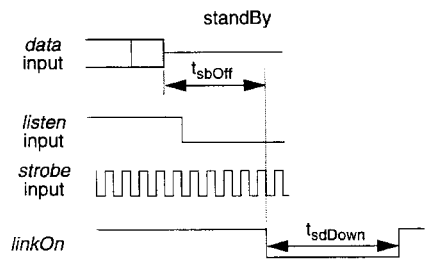

Figure 39—ShutDown entrance timing

Copyright ©1996 IEEE  
This is an unapproved IEEE Standards Draft, subject to change.

To ensure completion of the shutDown sequence, a minimum shutDown time, $t_{sdDown}$, is specified. The detailed shutDown sequence and timing constraints are signal-layer dependent; see 8.4 for details.

In most cases, power is maintained while the SLDRAMs are in shutDown; after the shutDown recovery, normal operations are resumed.

The time allowed for recovering from shutDown needs to account for the case where a refresh may be in progress internally at the time *linkOn* is sensed as high.

If power is lost while in the shutDown state, SLDRAM state may be lost and a shutOff recovery sequence is required, to establish the slaveId addresses and (when necessary) clear memory to a known state, as described in the following subclause.

8.4.2.1 ShutDown initiation

The SyncLink timing constraints applicable to entering the shutDown state are illustrated in figure 40. The shutDown mode is entered from the standBy mode, so a delay of $t_{sbOff}$ is required between the receipt of the standBy packet and the high-to-low transition of *linkOn*. Since *linkOn* is not a high speed signal, it is not relied on for precise timing in this protocol. Within time $t_{sdOffFast}$ the SLDRAM shall ignore further *strobe* and *flag* inputs, but shall ensure the validity of its *selectOut* signal until time $t_{sdOffSlow}$. Maintaining valid outputs while ignoring the inputs helps compensate for potential *linkOn*-signal skew between controller and SLDRAMs.

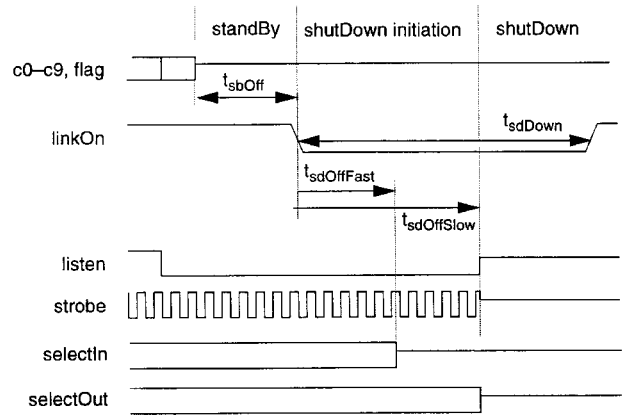

Figure 40—ShutDown initiation timing

8.4.2.2 ShutDown recovery

The *selectIn/selectOut* signals determine when shutDown recovery has completed.

Shutdown recovery is initiated by the low-to-high transition of the *linkOn* signal. Within time $t_{sdOnFast}$, SLDRAMs shall be driving their *selectOut* to zero. Until time $t_{sdOnSlow}$, SLDRAMs shall ignore their input signals; at that time, they may adjust their input receivers based on the *strobe* signal, as illustrated in figure 41.

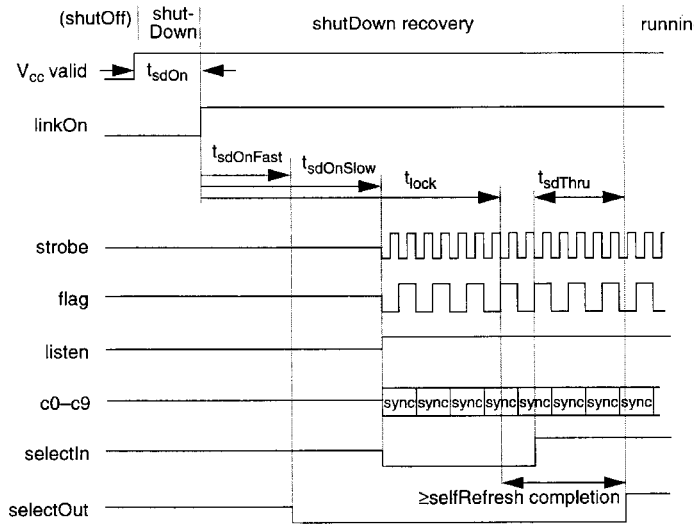

Figure 41—ShutDown recovery timing

The SLDRAM's receiver circuits shall be synchronized within $t_{lock}$. After that time, and after completing any selfrefresh operation that may be in progress, the SLDRAM allows the *selectIn* signal to propagate to the *selectOut* output, with a delay not to exceed $t_{sdThru}$. The *selectIn/selectOut* signals are expected to be daisy-chained through all SLDRAMs, and the controller delays packet transmissions until detecting a 1-valued *selectOut* signal from the final SLDRAM.

8.5 Selecting external PROM

The signal *selectPROM* shall be set to 1 by an *event* packet with an *enablePROM* code, and shall be set to 0 by an *event* packet with a *disablePROM* code and by *reset*.

This allows the same addressing mechanism that selects SLDRAMs to be used for selecting (by selectively enabling) external PROM (or EEPROM, etc.) devices that may contain information related to individual SLDRAMs or to modules containing multiple SLDRAMs.

The actual data access is expected to take place through a mechanism outside the scope of this standard, such as a low-speed bit-serial bus. Such a bus would otherwise require an independent means of establishing unique addresses for the various PROMs in a system, and relating those addresses to the SLDRAMs would be difficult.

78

Draft 0.99 October 14, 1996
Memory Interface (SyncLink)

IEEE
P1596.7-199X

Annexes

Annex A
Bibliography (informative)

The SyncLink document has been developed with other standards in mind. The standards listed below are cited as illustrations:

[B1] IEEE Std 1149.1–1990, Boundary-Scan Architecture.[1]

[B2] ANSI/IEEE Std 1596-1992, Scalable Coherent Interface (SCI) (or IEC/ISO DIS 13961).[2]

[B3] IEEE P1285, Scalable Storage Interface (Draft No. 1.00, July 1995 {TBD}).

[B4] IEEE Std 1394-1996, High Performance Serial Bus.[2]

Each of the foregoing standards is hereby incorporated by reference in its entirety for all purposes.

---

[1] IEEE publications are available from the Institute of Electrical and Electronics Engineers, Inc., Service Center, 445 Hoes Lane, P.O. Box 1331, Piscataway, NJ 08855-1331, 800-678-4333.
[2] ANSI/IEEE publications are available from the Institute of Electrical and Electronics Engineers, Service Center, 445 Hoes Lane, P.O. Box 1331, Piscataway, NJ 08855-1331, USA.

Copyright © 1996 IEEE
This is an unapproved IEEE Standards Draft, subject to change.

IEEE
P1596.7-199X

Draft 0.99 October 14, 1996
DRAFT Standard for A High-Speed

Copyright ©1996 IEEE
This is an unapproved IEEE Standards Draft, subject to change.

Draft 0.99  October 14, 1996
Memory Interface (SyncLink)

IEEE
P1596.7-199X

Annex B
Address Decoding (normative)

Table 6 shows the multicast addresses, with those addresses shaded that are not expected to be used.

Table 6 — Multicast slaveId addresses

| slaveId value | multicast range | slaveId value | multicast range | slaveId value | multicast range | slaveId value | multicast range |
|---|---|---|---|---|---|---|---|
| 64 | 0-1 | 80 | 16-17 | 96 | 32-33 | 112 | 48-49 |
| 65 | 0-3 | 81 | 16-19 | 97 | 32-25 | 113 | 48-51 |
| 66 | 2-3 | 82 | 18-19 | 98 | 34-35 | 114 | 50-51 |
| 67 | 0-7 | 83 | 16-23 | 99 | 32-39 | 115 | 48-55 |
| 68 | 4-5 | 84 | 20-21 | 100 | 36-37 | 116 | 52-53 |
| 69 | 4-7 | 85 | 20-23 | 101 | 36-39 | 117 | 52-55 |
| 70 | 6-7 | 86 | 22-23 | 102 | 38-39 | 118 | 54-55 |
| 71 | 0-15 | 87 | 16-31 | 103 | 32-47 | 119 | 48-63 |
| 72 | 8-9 | 88 | 24-25 | 104 | 40-41 | 120 | 56-57 |
| 73 | 8-11 | 89 | 24-27 | 105 | 40-43 | 121 | 56-59 |
| 74 | 10-11 | 90 | 26-27 | 106 | 42-43 | 122 | 58-59 |
| 75 | 8-15 | 91 | 24-31 | 107 | 40-47 | 123 | 56-63 |
| 76 | 12-13 | 92 | 28-29 | 108 | 44-45 | 124 | 60-61 |
| 77 | 12-15 | 93 | 28-31 | 109 | 44-47 | 125 | 60-63 |
| 78 | 14-15 | 94 | 30-31 | 110 | 46-47 | 126 | 62-63 |
| 79 | 0-31 | 95 | 0-63 | 111 | 32-63 | 127 | 0-63 |

Copyright ©1996 IEEE
This is an unapproved IEEE Standards Draft, subject to change.

Draft 0.99  October 14, 1996
Memory Interface (SyncLink)

IEEE
P1596.7-199X

The logic for fully decoding the multicast DRAM addresses of table 6 is illustrated in figure 42. The complete decoding supports powers-of-two multicast addressing: ×1, ×2, ×4, ×8, ×16, ×32, ×64, and broadcast.

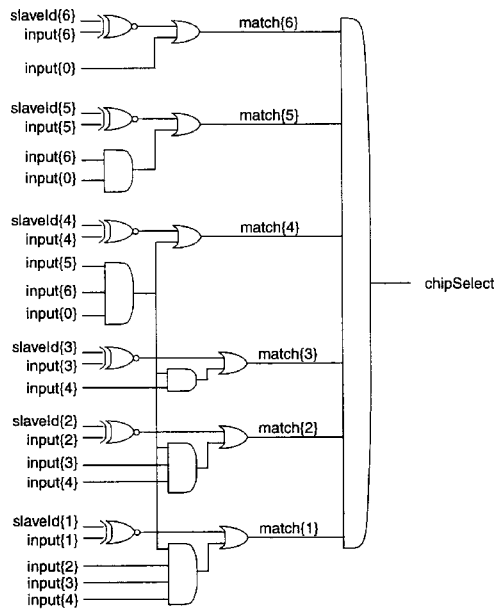

Figure 42 — Complete chipSelect decoding logic

The input{0}-through-input{6} signals are the most-through-least significant bits of the 8-bit chip address contained within the read/write command packets generated by the memory controller and broadcast to the attached DRAMs. The slaveId{1}-through-slaveId{6} are the most-through-least significant bits of the DRAMs 7-bit slaveId value; during initialization, unique slaveId values are assigned to each DRAM by the controller.

Although 16-chip-wide SIMMs are not expected to be used, ×16 multicast addressing can be used to concurrently access DRAMs on a 9-chip-wide SIMM (if the slaveId values have been properly initialized). The ×32 and ×64 addressing modes are not expected to be used but are included for completeness.

Copyright © 1996 IEEE
This is an unapproved IEEE Standards Draft, subject to change.

The logic for partial decoding of multicast addresses is slightly simpler, as illustrated in figure 43. This partial decoding supports most multicast addresses: ×1, ×2, ×4, ×8, ×16, and broadcast. To simplify the decoding hardware, the ×32 and ×64 multicast locations are decoded as broadcast.
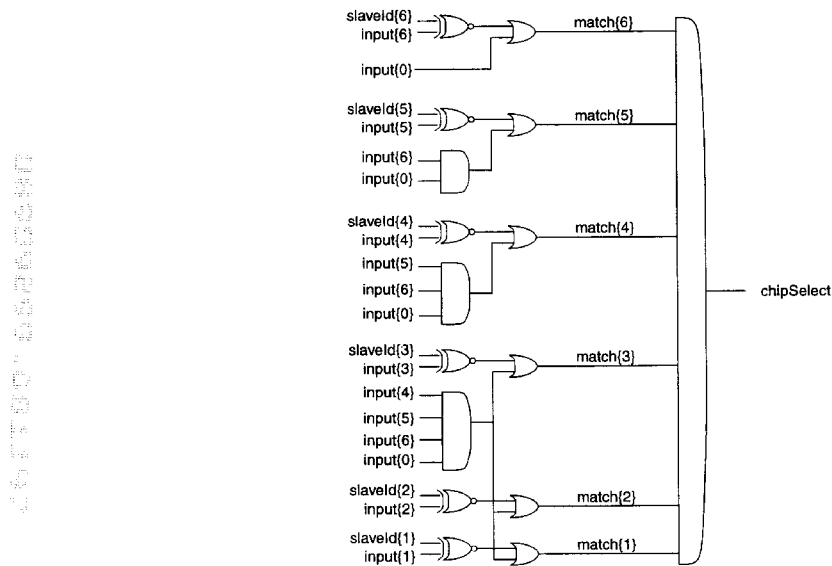
Figure 43 — Partial chipSelect decoding logic Draft 0.99 October 14, 1996
Memory Interface (SyncLink)

IEEE
P1596.7-199X

Copyright ©1996 IEEE
This is an unapproved IEEE Standards Draft, subject to change.

Draft 0.99   October 14, 1996  
Memory Interface (SyncLink)

IEEE  
P1596.7-199X

Annex C
Performance Model (informative)

When modeling the performance of an SLDRAM system, the following points should be taken into account:

Data transfers are in bursts of 4, 8, or 16 bits per *dataLink* signal.

Commands are 4 bits per *commandLink* signal.

Read data appear on the *dataLink* a certain time after the *read* command. Two values are possible for this time: a shorter delay, corresponding to column access time, for the case where the data are known to already be in the row buffers, and a longer delay for the case where the data have first to be fetched from the RAM array into the row buffers.

Write data appear on the *dataLink* at essentially the same time *read* data would have if generated from the same command packet. This is later than the RAM intrinsically would be ready for it, but delaying the data in this way improves schedulability. Writes have two possible delays, similar to reads.

Whenever changing from one device driving the *dataLink* to a different device driving it, a delay of 2 ticks is to be inserted to allow the bus to settle. This affects the timing when changing from read to write or write to read, or when changing from reading one SLDRAM to reading a different SLDRAM.

The timing of devices in normal operation is in multiples of 4 ticks, but an operation may be started on any 2-tick boundary when this does not interfere with active or pending operations. This reduces latency for starting an operation on an idle SyncLink system, and in certain other cases (depending on timing details for the particular SLDRAMs being modeled).

There are recovery times after closing a row (for writing the data back to the RAM array), and possibly when changing between write and read (depending on whether write and read share internal buses in the RAM). The controller is responsible for ensuring that other accesses to the affected bank do not occur too soon.

Copyright ©1996 IEEE  
This is an unapproved IEEE Standards Draft, subject to change.

Some examples are illustrated in figure 44, where A refers to one SLDRAM and B to another. ReadA0 and readA1 are from the same SLDRAM but different rows, one initially open and the other closed. The gap between readA1 and readB0 is the two ticks required for handing the *dataLink* from the one SLDRAM to the other. In the second group of transfers, only one SLDRAM is involved, but a gap is needed when changing from write to read.

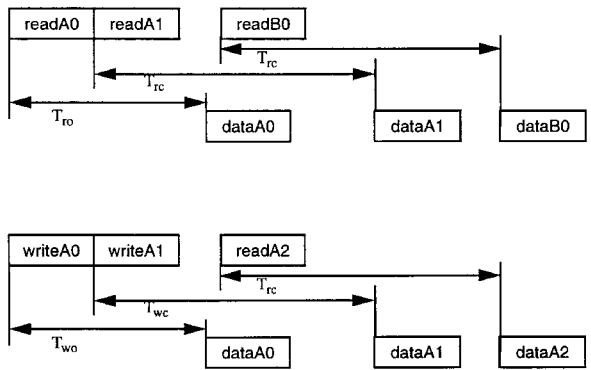

Figure 44 — Performance considerations

It is permissible to start a read-from-closed (slow) from one row, then start a read-from-open (fast) from a row in another bank or another SLDRAM, with the latter data returning first, if the SLDRAMs being modeled have a large enough difference between the from-open and from-closed access times to make this possible.

Rationale, resolved issues (not part of the published standard):

1) 16-bit and 18-bit interoperability. Although we continue to allow mixing of 16-bit and 18-bit devices, the cost of doing so has been reduced and placed on the 18-bit device. By default, the 18-bit device operates as a 16-bit device (with its extra inputs ignored and its extra outputs undriven). An event packet is used to enable the use of the extra bits.
   The advantages of this (when compared to the previous draft, which required that 16-bit devices drive all 18 signals) are that this reduces operating power for 16-bit and mixed systems.
2) PROM parameters. Although readable CSRs may be useful in the future, the current strategy is to allow RAM modules to provide their own PROM. We also note that the *selectIn/selectOut* signals can be used to selectively enable individual PROMs during the initialization process.
3) Refresh modes. Refresh timing is set by the controller, except in power-down operation. Addresses are provided by the RAMs. Addressed refresh is not supported, because it constrains implementations for little gain.
4) CSRs and JTAG may be used by implementers, but will not be discussed in this standard.
5) We began with two links:
   a) Unidirectional command/address/write data
   b) Unidirectional read data
   We noted that the balanced condition that lets the write data share the command/address link efficiently while keeping the read link busy is not always present. But often there are long bursts of write data or read data. We end with two links:
   a) Unidirectional command/address
   b) Bidirectional read data/write data.
   This new model is very similar to Synchronous DRAMs, which reduces the risks.
6) Refresh is counted down by RAMs according to their own needs, as set by a register during initialization.
7) We eliminate long blocks. There is no point in having transfers defined that exceed about 8 bits per signal, because there is plenty of time available on the commandLink to send the next command without interfering. (Later we added 16-bits-per-signal, to save power on the commandLink perhaps.)
8) We eliminate short blocks. There is no point in having transfers much shorter than the request packet, because such transfers are limited by request bandwidth.
9) We eliminate write enables. Partial-width writes are much more flexibly handled by the controller.
10) We choose multiples of one block size, with data transfers the same length as command transfers, because that is as good as one can do with our new pipelined model of operation.
11) We reduced the commandLink to 10 bits, as there is no need for it to be a power of two and 10 bits provides the best use of four ticks.

We have gone through several stages of simplification and performance improvement during the evolution of this specification.

We have simplified the timing to make it uniform for use in a highly pipelined memory architecture, simplified the command set to support only the few transfer options that are needed for keeping the links highly utilized, and simplified the layout and control problems by eliminating the need for driving a chipSelect while still allowing a very rich variety of configurations, including the popular SIMM configuration beloved by the PC consumer. We have a very versatile packet command format, which can expand indefinitely as RAM capacity grows in the future, yet does not burden today's systems with long address fields that might add latency.

Potentially useful considerations:

1) CSRs are attractive for determining the memory size and other properties, since there is no status response that could be readily used for detecting size by reading past the end of the array.

a) Some CSRs can be static, fixed at manufacturing time (array size, number of banks, etc.)
b) Some CSRs can be fixed at packaging time, by EEPROM, Flash, or fuses, to indicate device speed and minimum refresh rate (which may be affected by the process of packaging the chip).
c) Some CSRs change during operation, such as "parity error detected," useful for diagnostics.
d) Since some of these CSRs will surely be needed, the access paths will be in place anyway, which makes it attractive to implement all such functions by using the CSR mechanism.
e) If external EEPROM is used, it is highly desirable to at least perform EEPROM selection via its corresponding RAM chip. The RAM might decode a CSR address to generate the EEPROM select signal, for example, using one RAM pin for this purpose. Or, *selectIn* and not *selectOut* can be used as the EEPROM select signal, as is illustrated in the text now. That way all the mechanism for setting up unique addresses for the RAMs can be used as-is for addressing EEPROMs, without requiring the invention of an independent solution for reading them. Whether the data are actually accessed through the RAM or through a separate serial EEPROM bus is by comparison much less important than how the addressing is done.

What is claimed is:

1. A computer memory device, comprising:

an array of memory modules, each of which includes a matrix of memory cells, a plurality of data transfer ports, and a plurality of control transfer ports, with a memory interface coupled between said matrix of memory cells and said plurality of data transfer ports and said plurality of control transfer ports, wherein said memory interface of each memory module of said array includes chip-select logic in data communication with two of said plurality of control transfer ports defining select-in and select-out ports, and further including means in data communication with said array for storing address information within said chip-logic, said address information differing from address information stored in said chip-select logic of the memory modules of said array;

a controller having a system input port a plurality of data output ports, and a plurality of control/address output ports, said controller being adapted to produce control signals including chip address information and cell address information;

a data transfer bus coupled between said plurality of data transfer ports and said data output ports; and a control/address bus coupled between said plurality of control transfer ports and said control output ports, so that one of said plurality of control transfer ports of each of said modules are connected in common to transmit said chip select information and said address information between said controller and said array.

2. The computer memory device as recited in claim 1, further including:

a mounting board having a preset number of slots, each of said slots including a plurality of electrical connectors in data communication with said data transfer bus, said slots being adapted to receive one of said memory modules so that each of a subgroup of said plurality of electrical connectors contacts one of said plurality of control transfer ports; and a resistor of predetermined resistance being coupled between said electrical connectors corresponding to said select-in and select-out ports.

3. The computer memory device as recited in claim 1, further including means, in data communication with both said controller and said array, for varying a rate at which data transfer occurs between one of said memory modules and said controller.

4. The computer memory device as recited in claim 1, wherein said memory interfaces include a data register and a delay register having a delay associated therewith, wherein said controller stores an instruction set to be operated on by said memory modules, said controller causing transmission of dataSync information in response to said instruction set, with said controller being adapted to determine a rate at which data transfer occurs between one of said memory modules and said controller and to vary said rate by adjusting a value of said delay associated with said delay register.

5. The computer memory device as recited in claim 1, wherein said controller is adapted to produce a strobe signal and a listen signal and flag data, wherein said controller implements a standBy protocol after a predetermined number of clock cycles have passed without control/address transfers passing over said control/address bus.

6. The computer memory device as recited in claim 1, wherein said data transfer bus is bi-directional and said control/address bus is uni-directional.

7. The computer memory device as recited in claim 1, wherein said array of memory modules is a 1×1 array of dynamic random access memory integrated circuit.

8. The computer memory device as recited in claim 1, wherein said array includes a plurality of columns of memory modules, with each column having a data bus which is electrically isolated from data busses associated with the remaining columns of memory modules, wherein said data bus of each column is coupled between one of said plurality of data transfer ports and one of said plurality of data output ports.

9. The computer memory device as recited in claim 1, wherein said modules of said array are arranged in a plurality of rows and a plurality of columns, with each column having a data bus which is electrically isolated from data busses associated with the remaining columns of memory modules, wherein said data bus of each column is coupled between one of said plurality of data transfer ports and one of said plurality of data output ports.

10. The computer memory device as recited in claim 1, further comprising a clock generator producing a series of clock cycles, wherein said clock generator is coupled to both said controller and each of said modules of said array to synchronize data communication between said controller and said array over said control/address bus and said data transfer bus, with said chip address information and said cell address information being transmitted over said control/address bus in a time multiplexed manner so that said chip select information is transmitted during one clock cycle and said address information is transmitted during a different clock cycle.

11. The computer memory device as recited in claim 1, further comprising means, in data communication with both said controller and said array, for synchronizing a rate at which communication occurs between said controller and said array so that communication between any one of said memory modules of said array and said controller occurs at approximately the same rate as communication between any one of the remaining memory modules of said array and said controller.

12. The computer memory device as recited in claim 11, further comprising means, in signal communication with both said controller and said array, for synchronizing a rate at which information is written into said array occurs, independent of synchronizing a rate at which information is read from said array.

13. The computer memory device as recited in claim 11, wherein said synchronizing means includes a memory interface having a plurality of data registers and a plurality of delay registers, each of which has a delay associated therewith, wherein said controller stores a plurality of instruction packets containing computer readable information to be operated on by said memory modules.

14. The computer memory device as recited in claim 11, wherein said data transfer bus is bi-directional and said control/address bus is uni-directional.

15. The computer memory device as recited in claim 11, wherein said array has N×M rows and columns or memory modules, with each column having a data bus which is electrically isolated from data busses associated with the remaining columns of memory modules, wherein said data bus of each column is coupled between one of said plurality of data transfer ports and one of said plurality of data output ports.

16. A method for synchronizing transmission of information along data transfer busses and a control/address bus, said busses coupled between a controller a plurality of memory modules of a computer memory device, each of said memory modules having an access time associated therewith, said memory modules including control/address bus sampling circuitry, a delay register, and a slaveId register, said method including the steps of:

storing an initial value in said slaveId register;

transmitting from said controller to at least one of said memory modules, a Sync protocol information packet having a plurality of high and low bit values;

reading said Sync protocol information from said memory module, thereby ascertaining a time required for said Sync protocol information to propagate along said control/address bus;

adjusting said time by recording a preset value stored in said delay register; and adjusting a time required for data transfer on said data transfer bus of each of said memory modules to an access time which is a slowest access time of said plurality of memory modules.

17. The method as recited in claim 16, wherein said controller is coupled to a plurality of memory modules, and further including the step of recording in each of said slaveId registers a value differing from a value stored in the slaveId registers of the remaining memory modules.

18. The method as recited in claim 16, further including the step of adjusting a rate at which information is written into each of said plurality of memory modules independent of adjusting a rate a which information is read from each of said memory modules.

* * * * *

UNITED STATES PATENT AND TRADEMARK OFFICE
CERTIFICATE OF CORRECTION

PATENT NO.     : 6,226,723 B1
DATED          : May 1, 2001
INVENTOR(S)    : Gustavson et al.

It is certified that error appears in the above-identified patent and that said Letters Patent is hereby corrected as shown below:

Column 149,
Line 16, insert -- remaining -- following "the"
Line 18, insert -- , -- following "port"

Column 150,
Line 59, delete "or" and substitute -- of -- therefor

Column 151,
Line 1, insert -- and -- following "controller"

Column 152,
Line 14, delete "a" following "rate" and substitute -- at -- therefor Signed and Sealed this Twenty-second Day of April, 2003

JAMES E. ROGAN
*Director of the United States Patent and Trademark Office*